(12) United States Patent
Curbelo et al.

(10) Patent No.: US 12,117,503 B2
(45) Date of Patent: Oct. 15, 2024

(54) LOAD CONTROL DEVICE HAVING MISWIRE DETECTION

(71) Applicant: Lutron Technology Company LLC, Coopersburg, PA (US)

(72) Inventors: Mitchell R. Curbelo, Allentown, PA (US); Niravkumar K. Shah, Catasauqua, PA (US)

(73) Assignee: Lutron Technology Company LLC, Coopersburg, PA (US)

( * ) Notice: Subject to any disclaimer, the term of this patent is extended or adjusted under 35 U.S.C. 154(b) by 226 days.

(21) Appl. No.: 17/722,247

(22) Filed: Apr. 15, 2022

(65) Prior Publication Data

US 2022/0381852 A1 Dec. 1, 2022

Related U.S. Application Data

(60) Provisional application No. 63/235,456, filed on Aug. 20, 2021, provisional application No. 63/175,949, filed on Apr. 16, 2021.

(51) Int. Cl.
*G01R 31/55* (2020.01)
(52) U.S. Cl.
CPC .................................. *G01R 31/55* (2020.01)
(58) Field of Classification Search
CPC ..... G01R 31/55; H02H 11/002; H02H 11/003
See application file for complete search history.

(56) References Cited

U.S. PATENT DOCUMENTS

| | | | |
|---|---|---|---|
| 6,091,205 A | 7/2000 | Newman, Jr. et al. | |
| 6,380,692 B1 | 4/2002 | Newman, Jr. et al. | |
| 6,969,959 B2 | 11/2005 | Black et al. | |
| 7,872,429 B2 | 1/2011 | Steiner et al. | |
| 9,681,513 B2 | 6/2017 | Dadashnialehi et al. | |
| 9,699,863 B2 | 7/2017 | Weightman et al. | |
| 10,236,789 B2 | 3/2019 | Steiner et al. | |
| 2020/0178372 A1 | 6/2020 | Benning et al. | |
| 2020/0343722 A1* | 10/2020 | Mueller | H05B 47/20 |
| 2021/0022225 A1* | 1/2021 | Ostrovsky | H05B 45/50 |

\* cited by examiner

*Primary Examiner* — Jared Fureman
*Assistant Examiner* — Christopher J Clark
(74) *Attorney, Agent, or Firm* — Philip N. Smith; Glen R. Farbanish; Michael S. Czarnecki

(57) ABSTRACT

A load control device for controlling an amount of power delivered from an alternating-current (AC) power source to an electrical load may be configured to determine if a miswire condition exists at the load control device. For example, a control circuit of the load control device may be configured to detect a hot-to-dimmed-hot miswire condition in which a dimmed-hot terminal may be coupled to a hot side of the AC power source and a hot terminal may be coupled to the electrical load. In addition, the control circuit may be configured to detect a neutral-to-accessory-terminal miswire condition in which the hot terminal may be coupled to the hot side of the AC power source and an accessory terminal may be coupled to a neutral side of the AC power source. The control circuit may maintain a controllably conductive device non-conductive in response to determining that one of the miswire condition exists.

22 Claims, 13 Drawing Sheets

LOAD CONTROL DEVICE HAVING MISWIRE DETECTION

CROSS-REFERENCE TO RELATED APPLICATIONS

This application claims the benefit of U.S. Provisional Patent Application No. 63/175,949, filed on Apr. 16, 2021, and U.S. Provisional Patent Application No. 63/235,456, filed on Aug. 20, 2021, the entire disclosures of which are hereby incorporated by reference.

BACKGROUND

Home automation systems, which have become increasing popular, may be used by homeowners to integrate and control multiple electrical and/or electronic devices in their houses. For example, a homeowner may connect appliances, lights, blinds, thermostats, cable or satellite boxes, security systems, telecommunication systems, or the like to each other via a wireless network. The homeowner may control these devices using a controller or user interface provided via a phone, a tablet, a computer, and the like directly connected to the network or remotely connected via the Internet. These devices may communicate with each other and the controller to, for example, improve their efficiency, their convenience, and/or their usability.

A wall-mounted load control device may be adapted to be mounted in a standard electrical wallbox. For example, a wall-mounted dimmer switch may be coupled in series electrical connection between an alternating-current (AC) power source and an electrical load (e.g., a lighting load) for controlling the power delivered from the AC power source to the lighting load and thus the intensity of the lighting load. Many prior art wall-mounted load control devices are capable of transmitting and/or receiving wireless signals, e.g., radio-frequency (RF) signals), with other control devices in a load control system. For example, a wireless load control device may be configured to receive messages (e.g., digital messages) via the RF signals for controlling the electrical load and to transmit messages including feedback information regarding the status of the load control device and/or the electrical load. Such wall-mounted wireless load control devices have included antennas for transmitting and/or receiving the RF signals. Examples of prior-art wall-mounted load control devices are described in commonly-assigned U.S. Pat. No. 5,982,103, issued Nov. 9, 1999, and U.S. Pat. No. 7,362,285, issued Apr. 22, 2008, both entitled COMPACT RADIO FREQUENCY TRANSMITTING AND RECEIVING ANTENNA AND CONTROL DEVICE EMPLOYING SAME, the entire disclosures of which are hereby incorporated by reference.

SUMMARY

A load control device for controlling an amount of power delivered from an alternating-current (AC) power source to an electrical load may be configured to determine if a miswire condition exists at the load control device. The load control device may comprise a hot terminal adapted to be coupled to a hot side of the AC power source, and a dimmed-hot terminal adapted to be coupled to the electrical load. The load control device may further comprise a controllably conductive device coupled between the hot terminal and the dimmed-hot terminal, and a control circuit configured to control the controllably conductive device using a phase-control dimming technique to control the amount of power delivered to the electrical load. During a first miswire condition (e.g., hot-to-dimmed-hot miswire condition), the dimmed-hot terminal may be coupled to a hot side of the AC power source and the hot terminal may be coupled to the electrical load. The control circuit may be configured to maintain the controllably conductive device non-conductive in response to determining that the first miswire condition exists. For example, the control circuit may be configured to control the controllably conductive device to be conductive for a first portion of a half cycle and non-conductive for a second portion of the half cycle, and determine that the first miswire condition exists by detecting if voltage is not present across the controllably conductive device when the controllably conductive device is non-conductive during the second portion of the half cycle.

In addition, the load control device may comprise an accessory terminal adapted to be coupled to an accessory device, and a multi-location circuit coupled between the hot terminal and the accessory terminal. The control circuit may be configured to communicate messages with the accessory device via the accessory terminal. The control circuit may be configured to detect one or more miswire conditions at the accessory terminal. During a second miswire condition (e.g., a neutral-to-accessory-terminal miswire condition), the hot terminal may be coupled to the hot side of the AC power source and the accessory terminal may be coupled to the neutral side of the AC power source. The control circuit may be configured to maintain the controllably conductive device non-conductive in response to determining that the second miswire condition exists. For example, the multi-location circuit may be configured to receive an accessory-dimmer voltage at the accessory terminal and scale the accessory-dimmer voltage to generate a multi-location receive voltage. The control circuit may be configured to receive a message from the accessory device in response to the multi-location receive voltage. The control circuit may be configured to determine that the second miswire condition exists by detecting if voltage is present at the accessory terminal in a negative half cycle of the AC power source in response to the multi-location signal. The control circuit may be configured to sample the multi-location signal to determine if the second miswire condition exists, and to discharge voltage developed on wiring connected to the accessory terminal due to capacitance of the wiring while the control circuit is sampling the multi-location signal.

Further, the load control device may be configured to determine whether a third miswire condition (e.g., an accessory-dimmer miswire condition) exists. In the third miswire condition, one or more of the accessory devices may be wired to the wrong side of the load control device (e.g., wired to the load side of the load control device when the accessory devices should be wired to the line side of the load control device, or vice versa). For example, the control circuit configured to communicate messages with the accessory device via the accessory terminal during the negative half cycles. The control circuit may be configured to determine whether the third miswire condition exists by transmitting a query message during one or more positive half cycles and determining if a response message to the query message is received.

The load control device may be further configured to determine whether a fourth miswire condition (e.g., an accessory-dimmer-terminal-hot-short miswire condition) exists. During the fourth miswire condition, the hot side of the AC power source at the hot terminal may be shorted to the accessory terminal. The control circuit may be configured to maintain the controllably conductive device non-conductive in response to determining that the fourth miswire condition exists. For example, the control circuit may be configured to determine that the fourth miswire condition exists by driving the magnitude of the accessory-dimmer voltage high to attempt to charge the accessory devices connected to the accessory terminal and subsequently detecting if voltage is present at the accessory terminal in a negative half cycle of the AC power source in response to the multi-location signal. The control circuit may be configured to sample the multi-location signal to determine if the fourth miswire condition exists.

DETAILED DESCRIPTION

Figure 1:
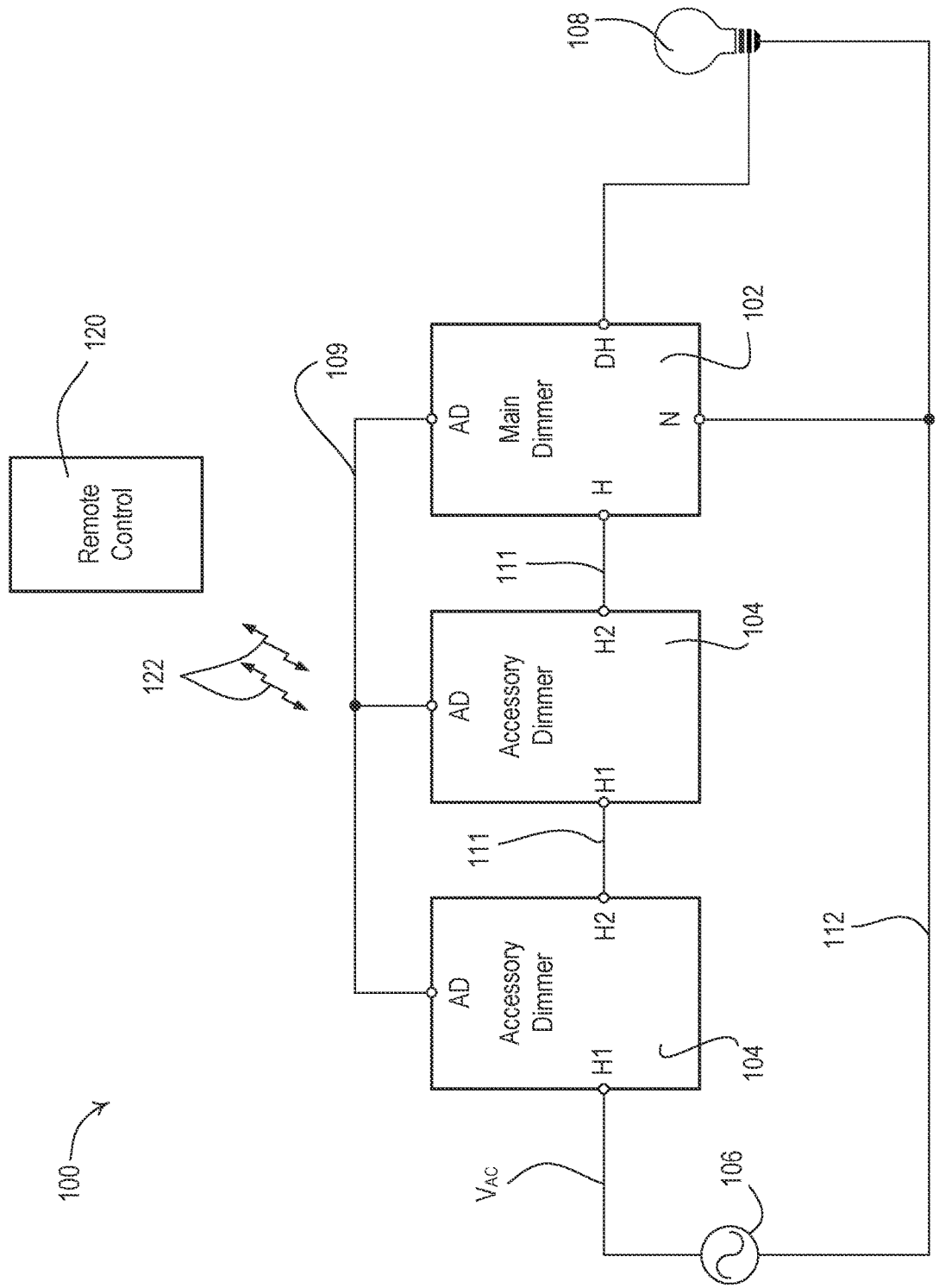
FIG. 1 depicts an example load control system that includes one or more example control devices.

FIG. 1 is a block diagram of an example of a load control system 100, e.g., a dimming system. The load control system 100 may comprise a main load control device, e.g., a main dimmer 102, and one or more remote load control devices, e.g., two accessory dimmers 104. The main dimmer 102 and accessory dimmers 104 may be coupled in series electrical connection between an alternating-current (AC) power source 106 and a lighting load 108, for example, via a traveler wiring 111. The traveler wiring 111 may couple the AC power source 106 to the lighting load 108 via the main dimmer 102 and the accessory dimmers 104, for example, to provide power to the lighting load 108. Neutral wiring 112 may couple the lighting load 108 back to the AC power source 106, for example, to provide a return path for any remaining power provided by the AC power source 106 and not dissipated by the lighting load 108. The main dimmer 102 and the accessory dimmers 104 may be configured as a multiple-location load control system that may replace a three-way and/or four-way switching system. For example, the accessory dimmers 104 may be wired to the line side of the load control system 100 (e.g., on the AC power source side of the load control system 100 and/or to the left of the main dimmer 102 as shown in FIG. 1), such that the main dimmer 102 is coupled to the load side of the load control system 100. Additionally and/or alternatively, the accessory dimmers 104 may be wired to the load side of the load control system 100 (e.g., on the lighting load side of the load control system 100 and/or to the right of the main dimmer 102 as shown in FIG. 1), such that the main dimmer 102 is coupled to the line side of the load control system 100. Further, the load control system 100 may include any number of (e.g., more or less than two) accessory dimmers 104.

The main dimmer 102 may comprise a first main terminal and a second main terminal. For example, the main dimmer 102 may comprise a hot terminal H (e.g., a line-side terminal) adapted to be coupled to the line side of the load control system 100 (e.g., to the AC power source 106 and/or one of the accessory dimmers 104) and a neutral terminal adapted to be coupled to the neutral wiring 112. The main dimmer 102 may be configured to receive an AC line voltage $V_{AC}$ from the AC power source 106 via the hot terminal H. The main dimmer 102 may comprise a dimmed-hot terminal DH (e.g., a load-side terminal) adapted to be coupled to the load side of the load control system 100 (e.g., to the lighting load 108). The main dimmer 102 may comprise a load control circuit (not shown) coupled between the hot and dimmed-hot terminals for controlling the amount of power delivered to the lighting load 108 (e.g., the main dimmer 102 may be configured to conduct a load current from the AC power source to the lighting load 108 via the hot and dimmed-hot terminals H, DH). The main dimmer 102 may comprise a user interface (not shown) that includes, for example, one or more actuators (e.g., buttons), such as a toggle actuator for turning the lighting load 108 on and off, an intensity adjustment actuator (e.g., a slider control or a pair of raise and lower buttons) for adjusting the intensity of the lighting load 108, and/or a color adjustment actuator (e.g., a slider control or a pair of raise and lower buttons) for adjusting the color of light emitted by the lighting load 108. The user interface may also comprise one or more visible indicators configured to be illuminated to provide, for example, a visual representation of the status and/or intensity of the lighting load 108.

The accessory dimmers 104 may each comprise a first main terminal H1 and a second main terminal H2, which may be coupled in series with the main dimmer 102 between the AC power source 106 and the lighting load 108 for conducting the load current from the AC power source 106 to the lighting load 108. The main dimmer 102 and the accessory dimmers 104 may each further comprise an accessory-dimmer terminal AD (e.g., accessory terminal) coupled together via an accessory-dimmer line 109 (e.g., a single accessory wiring). The accessory dimmers 104 may each include a user interface (not shown) that includes, for example, one or more actuators for controlling various operational characteristics (e.g., on/off, intensity, and/or color) of the lighting load 108. For example, The accessory dimmers 104 may include a toggle actuator for turning the lighting load 108 on and off, an intensity adjustment actuator (e.g., a slider control, a pair of raise and lower buttons, and/or a touch sensitive surface) for adjusting the intensity of the lighting load 108, and/or a color adjustment actuator (e.g., a slider control or a pair of raise and lower buttons) for adjusting the color of light emitted by the lighting load 108. The accessory dimmers 104 may each be configured to send signals indicating actuation of one or more of the actuators of the user interface to the main dimmer 102 via the accessory-dimmer line 109. Such signals or indications may cause the main dimmer 102 to control the lighting load 108 in accordance with the actuation state of the accessory dimmers 104. The user interfaces of the accessory dimmers 104 may also each comprise one or more visible indicators configured to be illuminated to provide, for example, a visual representation of the status and/or intensity of the lighting load 108.

In order to provide the visible indicators at the accessory dimmers 104, the accessory dimmers 104 may include a control circuit (e.g., which may comprise a microprocessor) and a power supply for powering the control circuit. The main dimmer 102 may provide an accessory dimmer supply voltage $V_{AD}$ (e.g., approximately 80-170 $V_{DC}$) on the accessory-dimmer line 109 to enable the power supplies of the accessory dimmers 104 to charge during a first portion (i.e., a charging time $T_{CHRG}$) of a half cycle of the AC power source 106. During a second portion (i.e., a communication time $T_{COMM}$) of the half cycle, the main dimmer 102 and the accessory dimmers 104 may be configured to transmit and receive messages (e.g., digital messages) via the accessory-dimmer line 109.

The load control system 100 may further comprise a remote control device 120, which may be configured to receive, via a user interface, a user input that may indicate a command (e.g., control data) for controlling the lighting load 108. For example, the user input may comprise an actuation of a button and/or a touch sensitive surface of the remote control device 120. The remote control device 120 may be configured transmit a message (e.g., a digital message) including the command for controlling the lighting load 108 via wireless signals, such as radio-frequency (RF) signals 122, in response to receiving the user input. For example, the remote control device 120 may be powered by a direct-current (DC) power source (e.g., a battery or an external DC power supply plugged into an electrical outlet). The main dimmer 102 may be configured to receive the RF signals 122 and may control the lighting load 108 in response to the command included in the wireless signals. Examples of battery-powered remote controls are described in greater detail in commonly assigned U.S. Pat. No. 8,330, 638, issued Dec. 11, 2012, entitled WIRELESS BATTERY POWERED REMOTE CONTROL HAVING MULTIPLE MOUNTING MEANS, the entire disclosure of which is hereby incorporated by reference.

Figure 2:
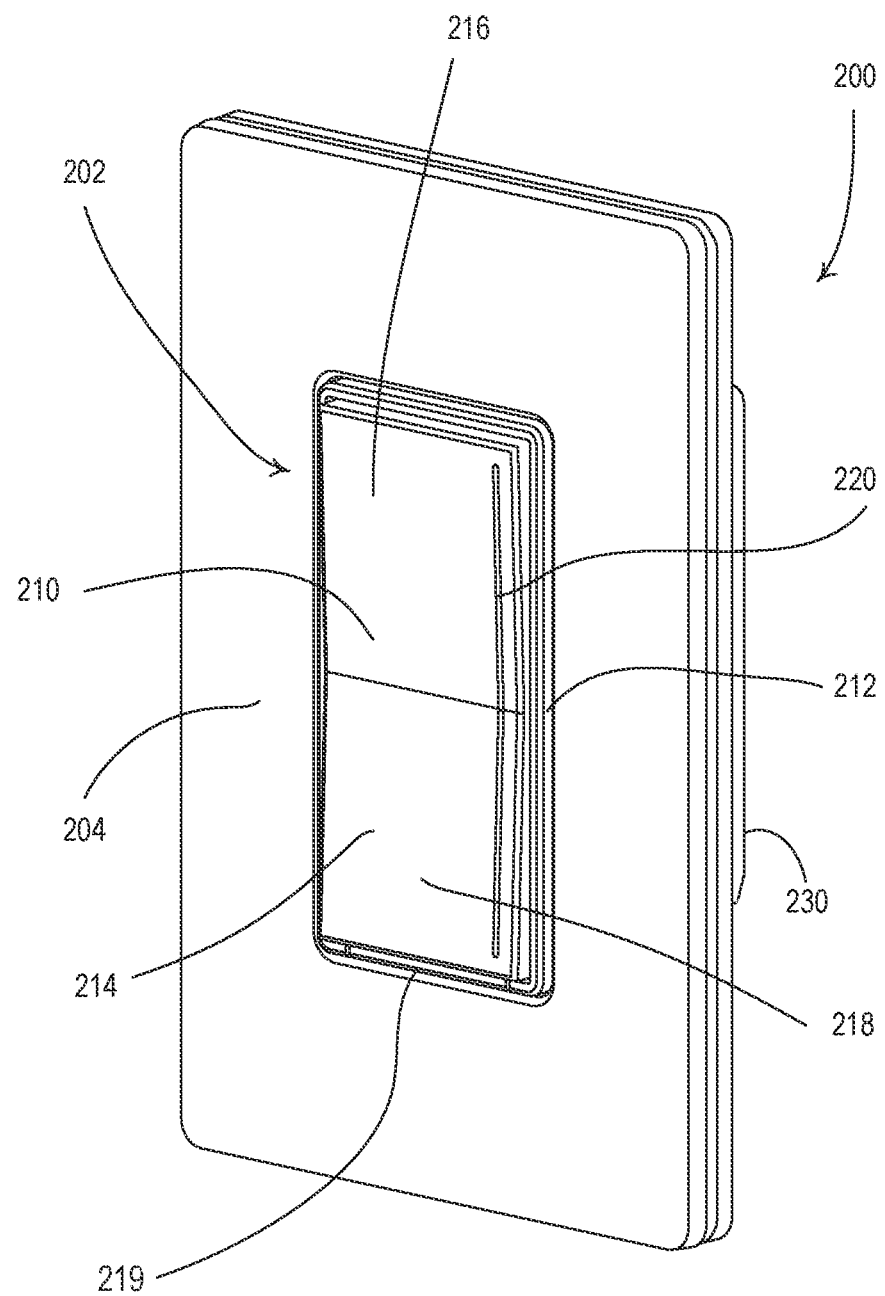
FIG. 2 is a perspective view of an example control device that may be deployed as a dimmer switch of the load control system of FIG. 1.

FIG. 2 is a perspective view of an example control device 200 that may be deployed as the main dimmer 102 and/or the accessory dimmers 104 of the load control system 100. The control device 200 may be coupled in series between a power source (e.g., the AC power source 106) and an electrical load (e.g., the lighting load 108) for controlling an amount of power delivered to the electrical load. The control device 200 may comprise a user interface 202 and a faceplate 204. The user interface 202 of the control device 200 may include an actuation member 210 that is configured to be mounted to a base portion 212 (e.g., a bezel). The actuation member 210 may comprise a front surface 214 having an upper portion 216 and a lower portion 218. The actuation member 210 may be configured to pivot (e.g., about a central axis) in response to an actuation of the upper portion 216 and the lower portion 218. The control device 200 may be configured to control a lighting load of the lighting control system 100 to turn the load on in response to an actuation (e.g., a tactile actuation) of the upper portion 216 and to turn the load off in response to an actuation (e.g., a tactile actuation) of the lower portion 218. At least a portion of the front surface 214 of the actuation member 210 may also be configured as a touch sensitive surface (e.g., a capacitive touch surface) that is configured to receive (e.g., detect) inputs (e.g., touch actuations), such as point actuations or gestures, from a user of the control device 200. The control device 200 may be configured to turn off and on the electrical load and/or control the amount of power delivered to the electrical load in response to actuation of the actuation member 210. For example, the control device 200 may be configured to turn off and on a lighting load, control the intensity level of the lighting load, and/or control a color (e.g., color temperature) of the lighting load in response to actuations of the actuation member 210. The control device 200 may further comprise an air-gap actuator 219 configured to actuate an internal air-gap switch inside the control device. For example, the air-gap actuator 219 may be pulled out from the control device 200 to open the air-gap switch and disconnect the lighting load from the AC power source.

The user interface 202 may also include a light bar 220 configured to be illuminated by one or more light sources (e.g., one or more LEDs) to visibly display information. The control device 200 may be configured to adjust the amount of power delivered to the lighting load (e.g., the intensity of a lighting load) in response to a position of an actuation (e.g., a touch actuation) of the front surface 214 of the actuation member 210 along the length of the light bar 220. When the control device 200 is a wall-mounted dimmer switch, the control device 200 may comprise a rear enclosure 230 for housing load control circuitry of the dimmer switch. Examples of control devices having capacitive touch surfaces are described in greater detail in commonly-assigned U.S. Pat. No. 10,109,181, issued Oct. 23, 2018, entitled GESTURE-BASED CONTROL DEVICE FOR CONTROLLING AN ELECTRICAL LOAD, the entire disclosure of which is hereby incorporated by reference. Although described primarily in context of a capacitive touch surface, it should be appreciated that the control device 200 is not so limited, and in some examples, at least a portion of the front surface 214 of the actuation member 210 may be configured as a different type of touch sensitive surface, such as a resistive touch surface, an inductive touch surface, a surface acoustic wave (SAW) touch surface, an infrared touch surface, acoustic pulse touch surface, or the like. In addition, the control device 200 may comprise another type of actuator, such as a slider control, a rocker switch, or other type of intensity adjustment actuator.

Figure 3:
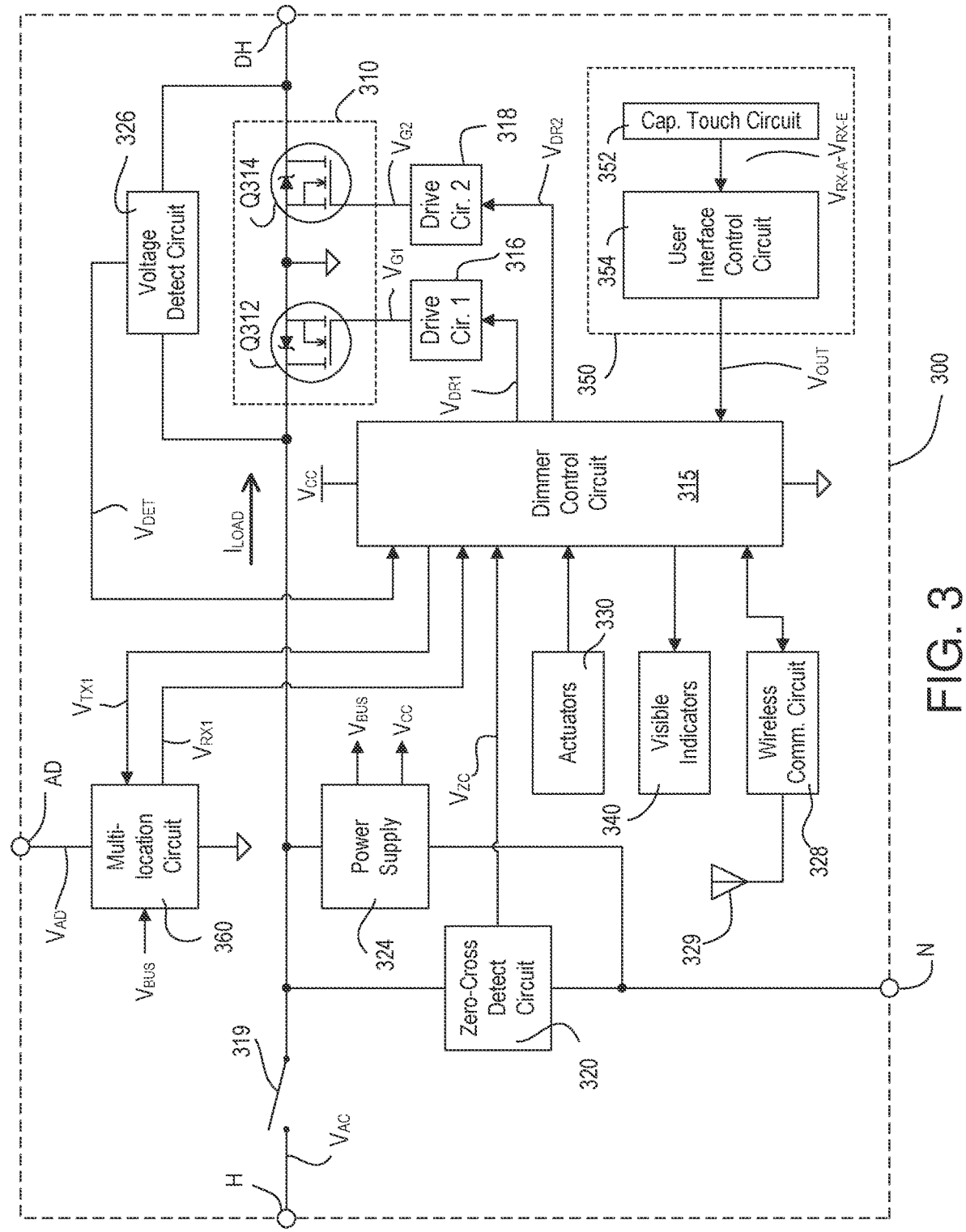
FIG. 3 is a simplified block diagram of an example main load control device that may be used in the load control system of FIG. 1.

FIG. 3 is a simplified block diagram of an example main load control device 300 (e.g., a dimmer switch) that may be deployed as, for example, the main dimmer switch 102 of the load control system 100 and/or the control device 200. The main load control device 300 may include a hot terminal H and a neutral terminal N (e.g., such as the hot terminal H and the neutral terminal N of the main dimmer 102 shown in FIG. 1) that may be adapted to be coupled to a hot side and a neutral side, respectively, of an AC power source (e.g., the AC power source 106). For example, the hot terminal H may be coupled directly to the hot side of the AC power source or indirectly to the hot side of the AC power source through one or more remote load control devices (e.g., the accessory dimmers 104 as shown in FIG. 1). The main load control device 300 may include a dimmed-hot terminal DH (e.g., such as the dimmed-hot terminal DH of the main dimmer 102) that may be adapted to be coupled (e.g., coupled directly) to an electrical load, such as a lighting load (e.g., the lighting load 108), which may be coupled between the dimmed-hot terminal DH and the neutral terminal N of the AC power source (e.g., as shown in FIG. 1). The main load control device 300 may also comprise an accessory-dimmer terminal AD (e.g., such as the accessory-dimmer terminal AD of the main dimmer 102 shown in FIG. 1), which may be adapted to be coupled to the remote load control devices via an accessory wiring for generating and/or receiving an accessory-dimmer voltage $V_{AD}$.

The main load control device 300 may include a controllably conductive device 310 coupled in series electrical connection between the hot terminal H and the dimmed-hot terminal DH (e.g., between the AC power source and the lighting load). As shown in FIG. 3, the controllably conductive 310 may comprise multiple (e.g., two) field-effect transistors (FETs) such as FETs Q312, Q314 coupled in anti-series connection. The junction of the FETs Q312, Q314 may be coupled to circuit common. The controllably conductive device 310 may also comprise, for example, a thyristor (e.g., a triac), a FET in a full-wave rectifier bridge, one or more insulated-gate bipolar junction transistors (IGBTs), or any suitable bidirectional semiconductor switch. The controllably conductive device 310 may conduct a load current $I_{LOAD}$ through the lighting load, and be controlled to control an amount of power delivered to the lighting load and thus an intensity level of the lighting load.

The main load control device 300 may include a dimmer control circuit 315. The dimmer control circuit 315 may include one or more of a processor (e.g., a microprocessor), a microcontroller, a programmable logic device (PLD), a field programmable gate array (FPGA), an application specific integrated circuit (ASIC), or any suitable controller or processing device. The dimmer control circuit 315 may be configured to control the controllably conductive device 310 using a phase-control dimming technique (e.g., a forward phase-control dimming technique or a reverse phase-control diming technique), such that a phase-control signal (e.g., a phase-cut voltage) is generated at the dimmed-hot terminal DH. The dimmer control circuit 315 may generate first and second drive signals $V_{DR1}$, $V_{DR2}$ that may be received by first and second gate drive circuits 316, 318, respectively. The first and second gate drive circuits 316, 318 may generate respective gate voltages $V_{G1}$, $V_{G2}$ that may be coupled to the gates of the respective FETs Q312, Q314 for rendering the FETs conductive and non-conductive in response to the first and second drive signals $V_{DR1}$, $V_{DR2}$, respectively. For example, the dimmer control circuit 315 may be configured to drive the magnitudes of the first and second drive signals $V_{DR1}$, $V_{DR2}$ low towards circuit common to render the FETs Q312, Q314 conductive, respectively. In other examples, the dimmer control circuit 315 may be configured to generate a single drive signal for controlling the FETs Q312, Q314.

When the controllably conductive device 310 is rendered conductive during the positive half cycles of the AC power source, the load current $I_{LOAD}$ may be conducted through the drain-source channel of the first FET Q312 and the body diode of the second FET Q314. When the controllably conductive device 310 is rendered non-conductive in the positive half cycles, the first FET Q312 (e.g., the positive-blocking FET) may block the load current $I_{LOAD}$ from flowing. When the controllably conductive device 310 is rendered conductive during the negative half cycles of the AC power source, the load current $I_{LOAD}$ may be conducted through the drain-source channel of the second FET Q314 and the body diode of the first FET Q312. When the controllably conductive device 310 is rendered non-conductive in the negative half cycles, the second FET Q312 (e.g., the negative-blocking FET) may block the load current $I_{LOAD}$ from flowing. The dimmer control circuit 315 may be configured to control the magnitude of the load current $I_{LOAD}$ conducted through the lighting load so as to control the intensity level of the lighting load across a dimming range between a low-end intensity level $L_{LE}$ and a high-end intensity level $L_{HE}$.

The main load control device 300 may comprise an air-gap switch 319 that may be coupled in series with the controllably conductive device 310. The air-gap switch 319 may be opened and closed in response to actuations of an air-gap actuator (e.g., the air-gap actuator 219). When the air-gap switch 319 is closed, the controllably conductive device 310 may be configured to conduct the load current $I_{LOAD}$ through the lighting load. When the air-gap switch 319 is open, the lighting load may be disconnected from the AC power source.

The main load control device 300 may comprise a zero-cross detect circuit 320 that may generate a zero-cross signal $V_{ZC}$ that may indicate zero-crossings of the AC line voltage $V_{AC}$. The dimmer control circuit 315 may receive the zero-cross signal $V_{ZC}$ and may be configured to render the controllably conductive device 310 conductive and/or non-conductive at predetermined times relative to the zero-crossing points of the AC line voltage $V_{AC}$ using the forward and/or reverse phase-control dimming techniques. The zero-cross detect circuit 320 may be coupled between the hot terminal H and the neutral terminal N for receiving the AC line voltage $V_{AC}$. For example, the zero-cross detect circuit 320 may comprise a low-pass active filter circuit (e.g., comprising one or more operational amplifiers), such as a fourth-order Bessel filter. The filter circuit may generate a filtered signal and may operate to substantially remove from (or attenuate in) the filtered signal high-frequency components of the AC line voltage $V_{AC}$ that are above the fundamental frequency. The zero-cross detect circuit 320 may compare the filtered signal to a threshold voltage for generating the zero-cross signal $V_{ZC}$. The dimmer control circuit 315 may be configured to measure and store a half cycle time THC between zero-crossings as indicated by the zero-cross signal $V_{ZC}$. Examples of a zero-cross detect circuit having a filter circuit are described in greater detail in U.S. Pat. No. 6,091,205, issued Jul. 18, 2000, entitled PHASE CONTROLLED DIMMING SYSTEM WITH ACTIVE FILTER FOR PREVENTING FLICKERING AND UNDESIRED INTENSITY CHANGES, the entire disclosure of which is hereby incorporated by reference.

The main load control device 300 may include a memory (not shown). The memory may be communicatively coupled to the dimmer control circuit 315 for the storage and/or retrieval of, for example, operational settings, such as, lighting presets and associated preset light intensities. In addition, the memory may be configured to store instructions, such as software-based instructions, for execution by the dimmer control circuit 315 to operate the main load control device 300 as described herein. The memory may be implemented as an external integrated circuit (IC) or as an internal circuit of the dimmer control circuit 315.

The main load control device 300 may include a power supply 324 configured to generate a main supply voltage $V_{CC}$ (e.g., a direct-current (DC) supply voltage) for powering the dimmer control circuit 315 and the other low-voltage circuitry of the main load control device 300. The power supply 324 may also generate a bus voltage $V_{BUS}$ for supplying power to the remote load control devices via the accessory-dimmer terminal AD. The main supply voltage $V_{CC}$ and the bus voltage $V_{BUS}$ may both be referenced to circuit common. The power supply 324 may be coupled between the hot terminal H and the neutral terminal N (e.g., across the AC power source), and may be configured to conduct a charging current from the AC power source to generate the main supply voltage $V_{CC}$ and/or the bus voltage $V_{BUS}$. Since the power supply 324 is coupled between the hot terminal H and the neutral terminal N, the power supply does not need to draw the charging current through the electrical load.

The main load control device 300 may also comprise a voltage detect circuit 326 coupled across the controllably conductive device 310. The voltage detect circuit 326 may be configured to generate a voltage-detect signal $V_{DET}$ that indicates a magnitude of a voltage developed across the controllably conductive device 310. For example, the voltage detect circuit 326 may be configured to compare the magnitude of the voltage developed across the controllably conductive device 310 to a voltage threshold (e.g., approximately 40 V), and drive a magnitude of the voltage-detect signal $V_{DET}$ high towards the supply voltage $V_{CC}$ when the voltage developed across the controllably conductive device 310 is less than the voltage threshold and low towards circuit common when the voltage developed across the controllably conductive device 310 is greater than the voltage threshold. The dimmer control circuit 315 may receive the voltage-detect signal $V_{DET}$, and determine, in response to the voltage-detect signal $V_{DET}$, whether voltage is developed across the controllably conductive device 310 or not (e.g., whether the voltage developed across the controllably conductive device 310 exceeds the voltage threshold or not). In addition, the dimmer control circuit 315 may be configured to determine if one of the FETs Q312, Q314 of the controllably conductive device 310 is shorted in response to the voltage-detect signal $V_{DET}$. For example, the dimmer control circuit 315 may be configured to determine that the FET Q312 is shorted when the dimmer control circuit 315 is not controlling the FET Q312 to be conductive during the positive half cycles and the voltage-detect signal $V_{DET}$ indicates that there is no voltage developed across the controllably conductive device 310 (e.g., the voltage developed across the controllably conductive device 310 is less than the voltage threshold). The dimmer control circuit 315 may be configured to determine that the FET Q314 is shorted when the dimmer control circuit 315 is not controlling the FET Q314 to be conductive during the negative half cycles and the voltage-detect signal $V_{DET}$ indicates that there is no voltage developed across the controllably conductive device 310 (e.g., the voltage developed across the controllably conductive device 310 is less than the voltage threshold). The dimmer control circuit 315 may be configured to enter a full-conduction mode (e.g., not adjust the amount of power delivered to the electrical load using the phase-control dimming technique) in response to determining that one of the FETs Q312, Q314 is shorted.

The main load control device 300 may comprise a wireless communication circuit 328. The wireless communication circuit 328 may include for example, a radio-frequency (RF) transceiver coupled to an antenna 329 for transmitting and/or receiving RF signals. The wireless communication circuit 328 may also include an RF transmitter for transmitting RF signals, an RF receiver for receiving RF signals, or an infrared (IR) transmitter and/or receiver for transmitting and/or receiving IR signals. The wireless communication circuit 328 may be configured to transmit messages (e.g., digital messages) via wireless signals, such as RF signals (e.g., the RF signals 122 shown in FIG. 1). The messages transmitted by the RF signals may include commands (e.g., control data) received by the dimmer control circuit 315 for controlling the lighting load. As described herein, the control data may be generated in response to touch actuations (e.g., point actuations or gestures) to adjust one or more operational aspects of the lighting load. The control data may include a command and/or identification information (e.g., such as a unique identifier) associated with the main load control device 300. The control device 300 may also be configured to receive configuration data via the wireless communication circuit 328. In addition, the main load control device 300 may comprise a wired communication circuit configured to transmit messages via a wired communication link.

The dimmer control circuit 315 may be responsive to inputs received from actuators 330 and/or a touch sensitive device 350. The dimmer control circuit 315 may control the controllably conductive device 310 to adjust the intensity level of the lighting load in response to the input received via the actuators 330 and/or the touch sensitive device 350. The dimmer control circuit 315 may receive respective input signals from the actuators 330 in response to tactile actuations of the actuators 330 (e.g., in response to movements of the actuators 330). For example, the actuators 330 may be actuated in response to tactile actuations of an upper portion the upper portion 216 and the lower portion 218 of the actuation member 210 of the control device 200. The touch sensitive device 350 may be configured to detect touch actuations (e.g., point actuations and/or gestures), and provide an output signal $V_{OUT}$ to the dimmer control circuit 315 indicating the detection. The dimmer control circuit 315 may be configured to translate the signals received from the actuators 330 and/or the touch sensitive device 350 into control data (e.g., one or more control signals), and control the controllably conductive device 310 in response to the control data.

The touch sensitive device 350 may include a capacitive touch circuit 352 and a user interface control circuit 354. The capacitive touch circuit 352 may comprise one or more capacitive touch elements. The user interface control circuit 354 may include one or more of a processor (e.g., a microprocessor), a microcontroller, a programmable logic device (PLD), a field programmable gate array (FPGA), an application specific integrated circuit (ASIC), or any suitable controller or processing device. The user interface control circuit 354 may include a memory and/or may use the memory 318. The user interface control circuit 354 may be configured to determine or detect a change in the capacitances of the capacitive touch pads of the capacitive touch circuit 352 (e.g., due to a user's finger actuating the front surface 214 of the actuation member 210), and generate the output signal $V_{OUT}$ in accordance with the change in capacitance of the capacitive touch pads. For example, the user interface control circuit 354 may receive one or more capacitive receive signals $V_{RX-A}$-$V_{RX-E}$ from the capacitive touch pads of the capacitive touch circuit 352, where each capacitive receive signal $V_{RX-A}$-$V_{RX-E}$ indicates the capacitance of a capacitive touch pad.

The user interface control circuit 354 may be configured to determine the position of the touch actuation along the front surface of the actuation member (e.g., along the light bar) in response to the receive signals $V_{RX-A}$-$V_{RX-E}$ generated by the receiving capacitive touch pads. In response, the user interface control circuit 354 may generate and provide the output signal $V_{OUT}$ to the dimmer control circuit 315. The output signal $V_{OUT}$ may indicate the position of the touch actuation along the front surface of the actuation member. The dimmer control circuit 315 may be configured to translate the output signal $V_{OUT}$ into control data (e.g., one or more control signals) for controlling one or more electrical loads. For example, the dimmer control circuit may cause the control data to be transmitted to the lighting load or a central controller of the load control system. In addition, the main load control device 300 may comprise another type of actuator, such as a slider control, a rocker switch, or other type of intensity adjustment actuator.

The dimmer control circuit 315 may be configured to illuminate visible indicators 340 (e.g., LEDs) to provide feedback of a status of the lighting load, to indicate a status of the main load control device 300, and/or to assist with a control operation (e.g., to provide a color gradient for controlling the color of the lighting load, to present backlit virtual buttons for preset, zone, or operational mode selection, etc.). The visible indicators 340 may be configured to illuminate a light bar (e.g., the light bar 220) and/or to serve as indicators of various conditions (e.g., miswire conditions).

The main load control device 300 may further comprise a multi-location circuit 360 configured to be coupled to one or more remote load control devices (e.g., the accessory dimmers 104) via an accessory wiring (e.g., the accessory-dimmer line 109) in a multi-location system (e.g., such as the multi-location system shown in FIG. 1). The multi-location circuit 360 may be coupled between the accessory-dimmer terminal AD and circuit common (e.g., to the junction of the FETs Q312, Q314), and may be configured to receive the bus voltage $V_{BUS}$ from the power supply 324. The multi-location circuit 360 may drive the accessory-dimmer voltage $V_{AD}$ high (e.g., to the bus voltage $V_{BUS}$) to charge the remote load control devices via the accessory wiring and/or the multi-location circuit 360 may allow for communication of a message (e.g., a digital message) between the main load control device 300 and the remote load control devices via the accessory wiring. The dimmer control circuit 315 may generate a multi-location transmit signal $V_{TX1}$ to the multi-location circuit 360 for causing the multi-location circuit 360 to transmit a message to the remote load control devices via the accessory wiring. The multi-location circuit 360 may also generate a multi-location receive signal $V_{RX1}$ which may be received by the dimmer control circuit 315 for receiving a message from the remote load control devices via the accessory wiring. For example, the multi-location circuit 360 may be configured to scale the accessory-dimmer voltage $V_{AD}$, such that the multi-location receive signal $V_{RX1}$ is a scaled version of the accessory-dimmer voltage $V_{AD}$.

When the control device 300 is located on the load side of the multi-location system, the dimmer control circuit 315 may control the multi-location circuit 360 to allow the remote load control devices to charge internal power supplies and transmit and receive messages during the negative half cycles. During the negative half cycles, the dimmer control circuit 315 may render the FET Q312 (e.g., the positive-blocking FET) conductive to couple the multi-location circuit 360 to the remote load control devices via the hot terminal H and the accessory-dimmer terminal AD. When the control device 300 is located on the line side of the multi-location system, the dimmer control circuit 315 may control the multi-location circuit 360 to allow the remote load control devices to charge internal power supplies and communicate messages during the positive half cycles. During the positive half cycles, the dimmer control circuit 315 may render the FET Q314 (e.g., the negative-blocking FET) conductive to couple the multi-location circuit 360 to the remote load control devices via the dimmed-hot terminal DH and the accessory-dimmer terminal AD.

Figure 4:
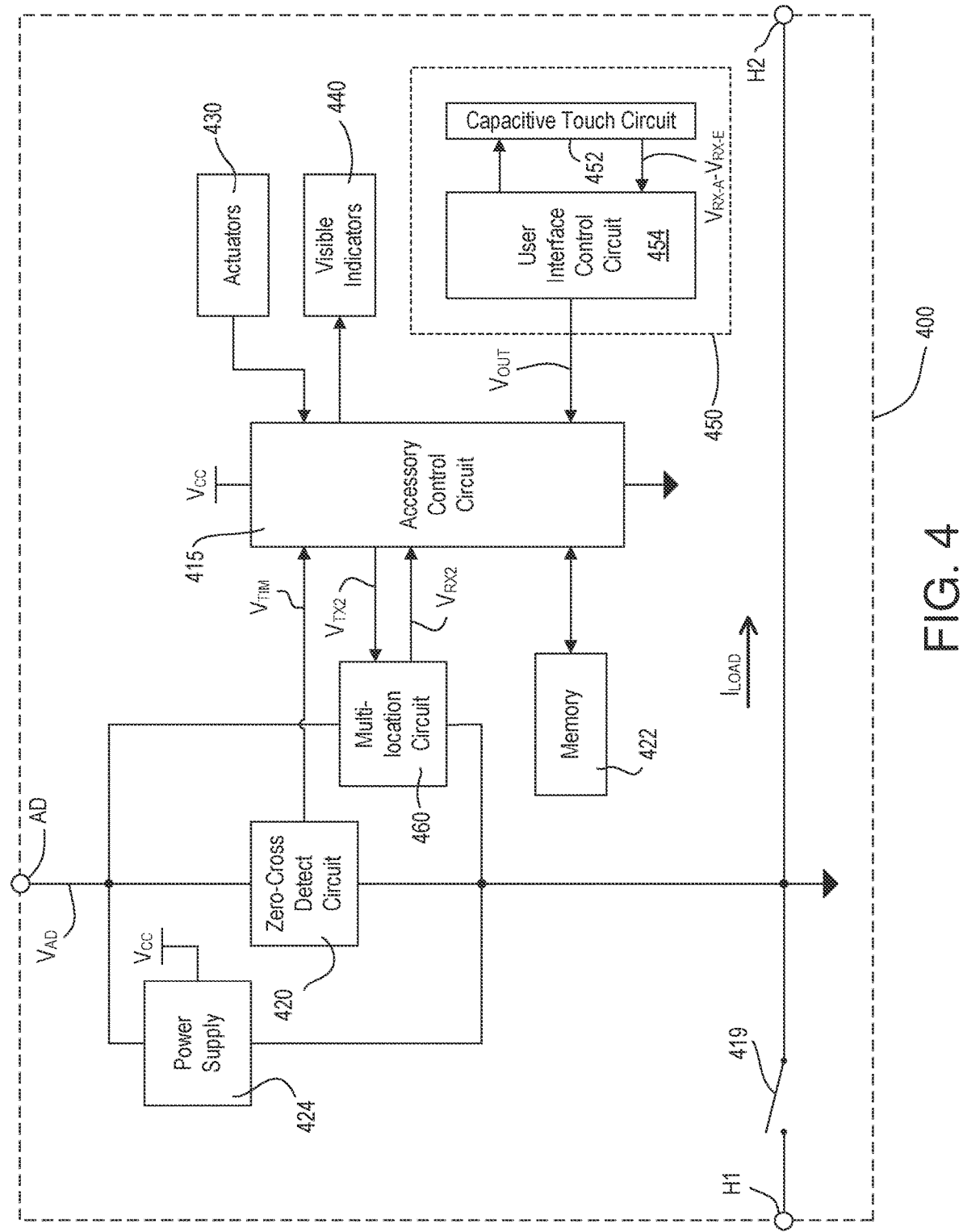
FIG. 4 is a simplified block diagram of an example remote load control device that may be used in the load control system of FIG. 1.

FIG. 4 is a simplified block diagram of an example remote load control device 400 (e.g., a dimmer switch) that may be deployed as, for example, one of the accessory dimmers 104 of the load control system 100 and/or the control device 200. The remote dimmer 400 may comprise one or more of the same functional blocks as the main load control device 300 shown in FIG. 3. The remote load control device 400 may comprise first and second hot terminals H1, H2 (e.g., such as the first and second hot terminals H1, H2 of the accessory dimmers 104) that may be coupled in series with a main load control device of a multi-location system (e.g., such as the main dimmer 102 and/or the main load control device 300) for controlling the amount of power delivered from an AC power source (e.g., the AC power source 106) to a lighting load (e.g., the lighting load 108). For example, the first and second hot terminals H1, H2 of the remote load control device 400 may be coupled in series with the bidirectional semiconductor switch 310 of the main load control device 300, and may be adapted to conduct the load current $I_{LOAD}$ from the AC power source to the lighting load. The remote load control device 400 may also comprise an accessory-dimmer terminal AD that is adapted to be coupled to an accessory-dimmer terminal of the main load control device via an accessory wiring (e.g., the accessory-dimmer line 109).

The remote load control device 400 may include an air-gap switch 419 that may be coupled in series between the first and second hot terminals H1, H2, and thus in series with the controllably conductive device of the main load control device (e.g., the controllably conductive device 310 of the main load control device 300). The air-gap switch 419 may be opened and closed in response to actuations of an air-gap actuator (e.g., the air-gap actuator 219). When the air-gap switch 419 is closed, the controllably conductive device of the main load control device may be configured to conduct the load current $I_{LOAD}$ through the lighting load. When the air-gap switch 419 is open, the lighting load may be disconnected from the AC power source.

The remote load control device 400 may include an accessory control circuit 415. The accessory control circuit 415 may include one or more of a processor (e.g., a microprocessor), a microcontroller, a programmable logic device (PLD), a field programmable gate array (FPGA), an application specific integrated circuit (ASIC), or any suitable controller or processing device. The remote load control device 400 may comprise a zero-cross detect circuit 420 that may be coupled between the first and second hot terminals H1, H2 and the accessory-dimmer terminal AD, and may generate a timing signal $V_{TIM}$ that may indicate timing information of a multi-location signal received from the main load control device (e.g., via the accessory-dimmer voltage $V_{AD}$). The remote load control device 400 may also comprise a memory 422. The memory 422 may be communicatively coupled to the accessory control circuit 415 for the storage and/or retrieval of, for example, operational settings, such as, lighting presets and associated preset light intensities. In addition, the memory 422 may be configured to store instructions, such as software-based instructions, for execution by the accessory control circuit 415 to operate the remote load control device 400 as described herein. The memory 422 may be implemented as an external integrated circuit (IC) or as an internal circuit of the accessory control circuit 415.

The remote load control device 400 may include a power supply 424 configured to generate a direct-current (DC) supply voltage $V_{CC}$ for powering the accessory control circuit 415 and the other low-voltage circuitry of the remote load control device 400. The power supply 424 may be coupled between the first and second hot terminals H1, H2 and the accessory-dimmer terminal AD, and may be configured to conduct a charging current from the main load control device during the charging time period $T_{CHRG}$ of a half cycle.

The remote load control device 400 may further comprise a multi-location circuit 460 configured to be coupled to the main load control device and/or one or more remote load control devices (e.g., the accessory dimmers 104) via an accessory wiring (e.g., the accessory-dimmer line 109) in a multi-location system (e.g., such as the multi-location system shown in FIG. 1). The multi-location circuit 460 may be coupled between the first and second hot terminals H1, H2 and the accessory-dimmer terminal AD for generating and/or receiving an accessory-dimmer voltage $V_{AD}$. The multi-location circuit 460 may allow for communication of a message (e.g., a digital message) between the remote load control device 400 and the main load control device via the accessory wiring. The accessory control circuit 415 may provide a multi-location transmit signal $V_{TX2}$ to the multi-location circuit 460 for causing the multi-location circuit 460 to transmit a message to the main load control device via the accessory wiring, and may receive a multi-location receive signal $V_{RX2}$ from the multi-location circuit 460 for receiving a message transmitted by the main load control device via the accessory wiring. For example, the multi-location circuit 460 may be configured to scale the accessory-dimmer voltage $V_{AD}$, such that the multi-location receive signal $V_{RX2}$ is a scaled version of the accessory-dimmer voltage $V_{AD}$. When the remote load control device 400 is located on the line side of the multi-location system, the power supply 424 may be configured to charge and the accessory control circuit 415 may be configured transmit and receive messages during the negative half cycles. When the remote load control device 400 is located on the load side of the multi-location system, the power supply 424 may be configured to charge and the accessory control circuit 415 may be configured transmit and receive messages during the positive half cycles.

The accessory control circuit 415 may be responsive to inputs received from actuators 430 and/or a touch sensitive device 450. The accessory control circuit 415 may transmit to the main load control device via the multi-location circuit 460 control data (e.g., indications of the inputs of the actuators 430 and/or the touch sensitive device 450) for causing the main load control device to, for example, turn on and off and/or adjust the intensity level of the lighting load in response to the inputs received via the actuators 330 and/or the touch sensitive device 350. The accessory control circuit 415 may receive respective input signals from the actuators 430 in response to actuations (e.g., tactile actuations) of the actuators 430 (e.g., in response to movements of the actuators 330). For example, the actuators 430 may be actuated in response to tactile actuations of the upper portion 216 and the lower portion 218 of the actuation member 210 of the control device 200. The touch sensitive device 450 may be configured to detect touch actuations (e.g., point actuations and/or gestures), and provide an output signal $V_{OUT}$ to the accessory control circuit 415 indicating the detection. The accessory control circuit 415 may be configured to translate the signals received from the actuators 430 and/or the touch sensitive device 350 into the control data (e.g., one or more control signals), and cause the control data to be transmitted to the main load control device via the multi-location circuit 460. In addition, the remote load control device 400 may comprise another type of actuator, such as a slider control, a rocker switch, or other type of intensity adjustment actuator.

The touch sensitive device 450 may include a capacitive touch circuit 452 and a user interface control circuit 454. The capacitive touch circuit 452 may comprise one or more capacitive touch elements. The user interface control circuit 454 may include one or more of a processor (e.g., a microprocessor), a microcontroller, a programmable logic device (PLD), a field programmable gate array (FPGA), an application specific integrated circuit (ASIC), or any suitable controller or processing device. The user interface control circuit 454 may include a memory and/or may use the memory 422. The user interface control circuit 454 may be configured to determine or detect a change in the capacitances of the capacitive touch pads of the capacitive touch circuit 452 (e.g., due to a user's finger actuating the front surface 214 of the actuation member 210), and generate the output signal $V_{OUT}$ in accordance with the change in capacitance of the capacitive touch pads. For example, the user interface control circuit 454 may receive one or more capacitive receive signals $V_{RX-A}$-$V_{RX-E}$ from the capacitive touch pads of the capacitive touch circuit 452, where each capacitive receive signal $V_{RX-A}$-$V_{RX-E}$ indicates the capacitance of a capacitive touch pad.

The user interface control circuit 454 may be configured to determine the position of the touch actuation along the front surface of the actuation member (e.g., along the light bar) in response to the receive signals $V_{RX-A}$-$V_{RX-E}$ generated by the receiving capacitive touch pads. In response, the user interface control circuit 454 may generate and provide the output signal $V_{OUT}$ to the accessory control circuit 415. The output signal $V_{OUT}$ may indicate the position of the touch actuation along the front surface of the actuation member. The accessory control circuit 415 may be configured to translate the output signal $V_{OUT}$ into control data (e.g., one or more control signals) for controlling one or more electrical loads. For example, the accessory control circuit 415 may cause the control data to be transmitted to the main load control device 300.

The accessory control circuit 415 may be configured to illuminate visible indicators 440 (e.g., LEDs) to provide feedback of a status of the lighting load, to indicate a status of the remote load control device 400, and/or to assist with a control operation (e.g., to provide a color gradient for controlling the color of the lighting load, to present backlit virtual buttons for preset, zone, or operational mode selection, etc.). The visible indicators 440 may be configured to illuminate a light bar (e.g., the light bar 220) and/or to serve as indicators of various conditions.

In some embodiments, the remote load control device 400 may not comprise the air-gap switch 419. As such, the remote load control device 400 may comprise a single hot terminal as opposed to the first and second hot terminals H1 and H2. For example, the single hot terminal of the remote load control device 400 may be connected to the hot terminal H of the main load control device (e.g., the main dimmer 102 shown in FIG. 1) and to the lighting load (e.g., the lighting load 108), as well as the single hot terminal of one or more additional remote load control devices. When having only a single hot terminal, the remote load control device 400 may not be adapted to conduct the load current $I_{LOAD}$ from the AC power source to the lighting load, since for example, the dimmed-hot terminal DH of the main load control device may be connected directly to the lighting load (e.g., without traveling through the remote load control device).

Figure 5:
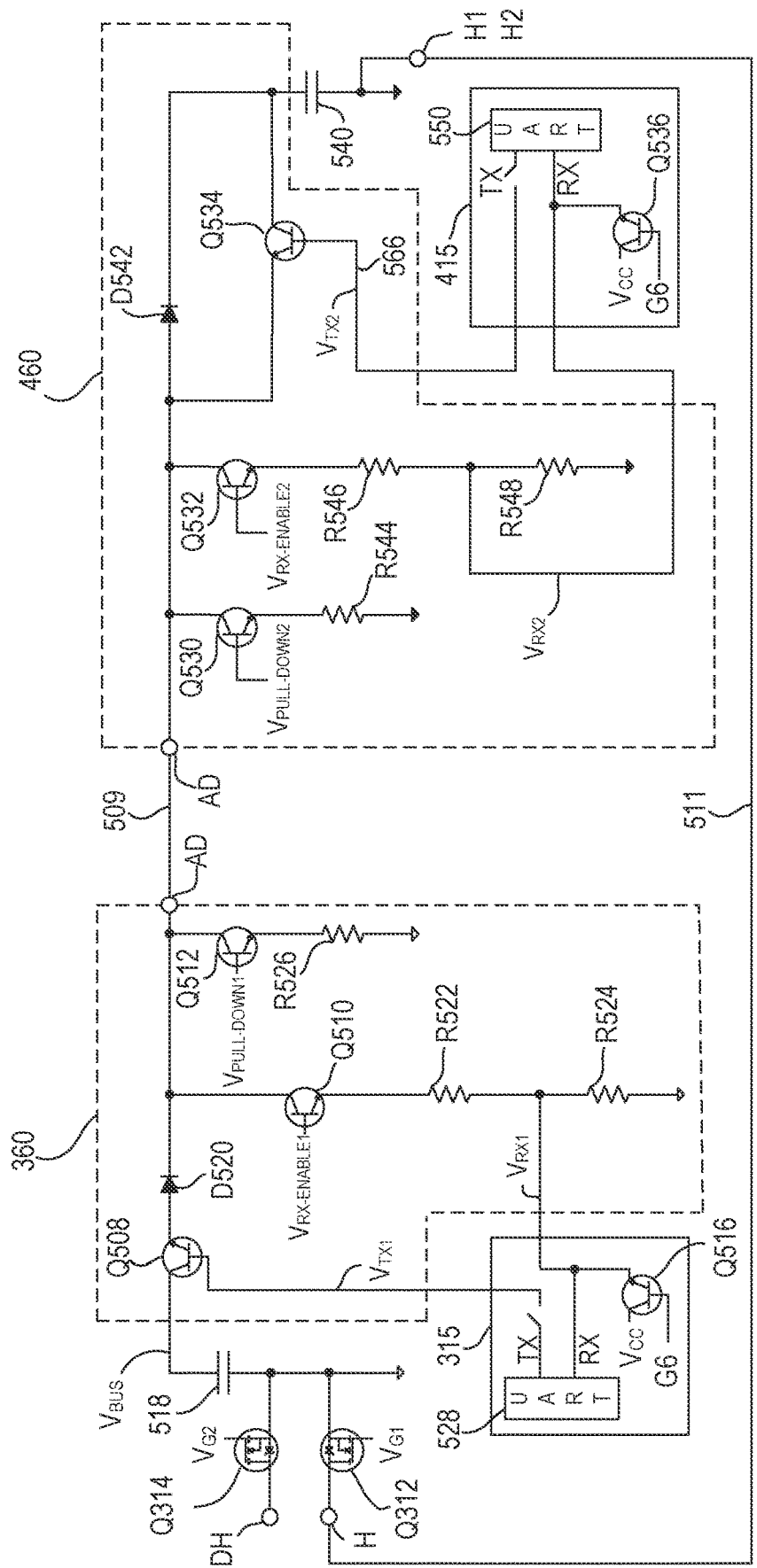
FIG. 5 is a simplified schematic diagrams illustrating multi-location circuits and control circuits of the main and remote load control devices of FIGS. 3 and 4.

FIG. 5 is an example schematic diagram of a multi-location circuit and a control circuit, e.g., the multi-location circuit 360 and the dimmer control circuit 315 of the main load control device 300, and/or the multi-location circuit 460 and the accessory control circuit 415 of the remote load control device 400. Although described with respect to the remote load control device 400, the description of FIG. 5 may be applicable to the remote load control device 400, either entirely or in part. The main load control device 300 may be connected to the remote load control devices 400 via an accessory-dimmer line 509 (e.g., the accessory-dimmer line 109) and a traveler line (e.g., the traveler line 111). The traveler line 511 may be connected between the hot terminal or dimmed-hot terminal of the main load control device 300 and one of the hot terminals of the remote load control device 400. The main load control device 300 may communicate (e.g., transmit and receive messages) and deliver power to the remote load control device 400 via the accessory-dimmer line 509.

The multi-location circuit 360 of the main load control device 300 may comprise an NPN bipolar junction transistor Q508, an NPN bipolar junction transistor Q510, an NPN bipolar junction transistor Q512, a diode D520, a resistor R522, a resistor R524, and/or a resistor R526. The dimmer control circuit 315 of the main load control device 300 may comprise a universal asynchronous receiver/transmitter (UART) 528 and/or an NPN bipolar junction transistor Q516. The UART 528 may be an internal circuit of a microprocessor of the dimmer control circuit 315. The multi-location circuit 360 may be coupled between the accessory-dimmer terminal AD and circuit common, and may receive the bus voltage $V_{BUS}$ from a capacitor 518 (e.g., which may be an output storage capacitor of the power supply 324). The hot terminal H and the dimmed-hot terminal DH of the main load control device 300 may be coupled to circuit common through the respective FETs Q312, Q314 of the controllably conductive device 310.

The collector of the transistor Q508 of the multi-location circuit 360 may be coupled to the capacitor 518 for receiving the bus voltage $V_{BUS}$. Accordingly, the collector of the transistor Q508 may be connected to the hot terminal H of the main load control device 300 through the FET Q312 and the capacitor 518. The emitter of the transistor Q508 may be connected to the accessory-dimmer line 509 through the diode D520. The base of the transistor Q508 may be connected to the transmit node of the UART 528. The collector of the transistor Q510 may be connected to the accessory-dimmer line 509 and the emitter of the transistor Q510 may be connected to circuit common through the resistors R522, R524. The junction of the resistors R522, R524 may be coupled to the receive node (Rx) of the UART 528. The collector of the transistor Q512 may be connected to the accessory-dimmer line 509 and the emitter of the transistor Q512 may be connected to the circuit common through the resistor R526.

The multi-location circuit 360 of the remote load control device 400 may comprise an NPN bipolar junction transistor Q530, an NPN bipolar junction transistor Q532, an NPN bipolar junction transistor Q534, a diode D542, a resistor R544, a resistor R546, and/or a resistor R548. The accessory control circuit 415 of the remote load control device 400 may comprise a universal asynchronous receiver/transmitter (UART) 550 and an NPN bipolar junction transistor Q536. The remote load control device 400 may comprise a capacitor 540, which may be coupled across the input of the power supply 424 of the remote load control device 400. As such, the capacitor 540 may be coupled between the multi-location circuit 460 and a hot terminal H1/H2 to charge through the diode D542 from the main load control device 300, via the multi-location circuit 460, during the charging time period $T_{CHRG}$ of a half cycle. The power supply 424 may conduct current from the main load control device 300 and/or from the capacitor 540 to generate the DC supply voltage $V_{CC}$ for powering the accessory control circuit 414 and other low voltage circuitry of the remote load control device 400.

The collector of the transistor Q530 may be connected to the accessory-dimmer line 509 and the emitter of the transistor Q530 may be connected to the circuit common through the resistor R544. The collector of the transistor Q532 may be connected to the accessory-dimmer line 509 and the emitter of the transistor Q532 may be connected to the circuit common through the resistors R546, R548. The junction of the resistors R546, 548 may be coupled to the receive node (Rx) of the UART 550. The collector of the transistor Q534 may be connected to the capacitor 540 and the emitter of the transistor Q534 may be connected to the accessory-dimmer line 509. The base of the transistor Q534 may be connected to the transmit node of the UART 550.

The main load control device 300 and/or the remote load control device 400 may control the accessory-dimmer line 509 using tri-state logic. Tri-state logic may be referred to as tri-state communication, three-state logic, three-state logic, and/or the like. The sender (e.g., the main load control device 300 or the remote load control device 400) may control the accessory-dimmer line 509 into one of three states, an active pull-up state, and an active pull-down state, or a high impedance state. The main load control device 300 and/or the remote load control device 400 may control the accessory-dimmer line 509 using tri-state logic to, for example, charge a power supply (e.g., capacitor 540) of the remote load control device 400 and/or communicate with one another.

The main load control device 300 may charge the capacitor 540 of the remote load control device 400 during a half cycle of an AC voltage waveform using the accessory-dimmer line 509. The main load control device 300 may actively pull up the accessory-dimmer line 509 to generate an accessory-dimmer supply voltage $V_{SUP}$ on the accessory-dimmer line 509 during the changing time period $T_{CHRG}$. In the active pull up state, the potential between the accessory-dimmer line 509 and the traveler line 511 may vary between approximately 80 to 170 volts. To pull up the accessory-dimmer line 509 during the charging time period $T_{CHRG}$ of the negative half cycles, the positive-blocking FET (e.g., the FET Q312) and the transistor Q508 of the main load control device 300 may be rendered conductive, while the transistor Q510 and the transistor Q512 of the main load control device 300, and the transistor Q530, the transistor Q532, and the transistor Q534 of the remote load control device 400 may not be rendered conductive. As such, a charging current may be conducted from the capacitor 518 through the FET Q312, the transistor Q508, the diode D520, the accessory-dimmer line 509, and the diode D542 to charge the capacitor 540 of the remote load control device 400. Therefore, the capacitor 540 of the remote load control device 400 may be charged by the main load control device 300 via the accessory-dimmer line 509 and the multi-location circuit 460 and the power supply 424 may generate the DC supply voltage $V_{CC}$.

The main load control device 300 and the remote load control device 400 may communicate during a half cycle of an AC voltage waveform using the accessory-dimmer line 509. For example, the main load control device 300 may charge the capacitor 540 of the remote load control device 400, and the main load control device 300 and the remote load control device 400 may communicate at least a portion of a message during a single half cycle of an AC voltage waveform.

The main load control device 300 and the remote dimmers 504 may communicate with one another by controlling the accessory-dimmer line 509. For example, the main load control device 300 and/or the remote load control device 400 may communicate by placing the accessory-dimmer line 509 in an active pull-up state and/or an active pull-down state. The receiver (e.g., the main load control device 300 or the remote load control device 400) may interpret a "1" bit when the accessory-dimmer line 509 is in the active pull-up state, a "0" bit when the accessory-dimmer line 509 is in the active pull-down state, and nothing when the accessory-dimmer line 509 is in the high impedance state. In the active pull up state, the potential between the accessory-dimmer line 509 and the traveler wire 511 may vary between approximately 80 to 170 volts. In the active pull-down state, there may be no potential between the accessory-dimmer line 509 and the traveler wire 511. In the high impedance state, the potential between the accessory-dimmer line 509 and the traveler wire 511 may depend on the charge stored by the line capacitance of the electrical wiring between the main load control device 300 and the remote load control device 400, i.e., the accessory-dimmer line 509. The use of the active pull-up state and active-pull down state may allow for faster and/or more reliable communication, for example, because the active pull-up state and active-pull down state may be characterized by sharper edges between communications.

When the main load control device 300 is transmitting a message to the remote load control device 400, the FET Q312 of the main load control device 300 may be rendered conductive. To receive a message from the main load control device 300, the remote load control device 400 may render the transistor Q532 conductive (e.g., via a receive-enable control signal $V_{RX-ENABLE2}$, which may be generated by the accessory control circuit 415 and received by the base of the transistor Q532), such that a multi-location receive signal $V_{RX2}$ is received by the accessory control circuit 415 of the remote load control device 400. To place the accessory-dimmer line 509 in the active pull up state, the main load control device 300 may render the transistor Q508 conductive and the transistor Q512 non-conductive. As such, the accessory-dimmer line 509 is pulled up (i.e., pulled-up to approximately 80-170 volts) and the remote load control device 400 (i.e., the UART 550 of the accessory control circuit 415) interprets a "1" bit being communicated. To place the accessory-dimmer line 509 in the active pull down state, the main load control device 300 may render the transistor Q508 non-conductive and the transistor Q512 conductive. As such, the accessory-dimmer line 509 is pulled down and has substantially the same voltage potential as the traveler wire 511. When the accessory-dimmer line 509 is pulled-down, the remote load control device 400 interprets a "0" bit being communicated. For example, the transistor Q512 may be rendered conductive (e.g., only rendered conductive) to transmit a "0" bit. Therefore, the main load control device 300 may render a first switching circuit (e.g., transistor Q508) and a second switching circuit (e.g., transistor Q512) conductive and non-conductive on a complementary basis to transmit a message to the remote load control device 400 via the accessory-dimmer line 509 during the communication period $T_{COMM}$ of the half cycle of the AC power source. For example, during communication, the main load control device 300 may actively pull-up or pull-down the accessory-dimmer line 509 to communicate a "1" bit or a "0" bit, respectively, by rendering the transistors Q508, Q512 conductive or non-conductive on a complementary basis.

When the remote load control device 400 is transmitting a message to the main load control device 300, the transistor Q534 of the remote load control device 400 may be rendered conductive. To receive a message from the remote load control device 400, the main load control device 300 may render the transistor Q510 conductive (e.g., via a receive-enable control signal $V_{RX-ENABLE1}$, which may be generated by the dimmer control circuit 315 and received by the base of the transistor Q510), such that a multi-location receive signal $V_{RX1}$ is received by the dimmer control circuit 315 of the main load control device 300. To place the accessory-dimmer line 509 in the active pull up state, the remote load control device 400 may render the transistor Q534 conductive and the transistor Q530 non-conductive. As such, the accessory-dimmer line 509 is pulled up (e.g., pulled-up to approximately 80-170 volts) and the main load control device 300 (e.g., the UART 528 of the dimmer control circuit 315) interprets a "1" bit being communicated. To place the accessory-dimmer line 509 in the active pull-down state, the remote load control device 400 may render the transistor Q534 non-conductive and the transistor Q530 conductive. As such, the accessory-dimmer line 509 is pulled down and has substantially the same voltage potential as the traveler wire 511. When the accessory-dimmer line 509 is pulled-down, the main load control device 300 interprets a "0" bit being communicated. For example, the transistor Q530 may be rendered conductive (e.g., only rendered conductive) to transmit a "0" bit. Therefore, the remote load control device 400 may render a first switching circuit (e.g., transistor Q534) and a second switching circuit (e.g., transistor Q530) conductive and non-conductive on a complementary basis to transmit a message to the main load control device 300 via the accessory-dimmer line 509 during the communication period $T_{COMM}$ of the half cycle of the AC power source. For example, during communication, the remote load control device 400 may actively pull-up or pull-down the accessory-dimmer line 509 to communicate a "1" bit or a "0" bit, respectively, by rendering the transistors Q530, Q534 conductive or non-conductive on a complementary basis.

The accessory-dimmer line 509 may be placed in the high impedance state. To place the accessory-dimmer line 509 in the high impedance state, the FET Q312 may be rendered conductive and the transistors Q508, Q510, and Q512 of the main load control device 300 and the transistors Q530, Q532, and Q534 of the remote dimmer may be rendered non-conductive. As such, in the high impedance state, the potential between the accessory-dimmer line 509 and the traveler wire 511 may depend on the charge stored by the accessory-dimmer line 509. The interpretation of the accessory-dimmer line 509 by the receiver (e.g., the main load control device 300 or the remote load control device 400) in the high impedance state is indeterminable. The multi-location circuits 360, 460 dissipate less power in the high impedance state.

In the multi-location circuit 360, a pull-down control signal $V_{PULL-DOWN1}$ received by the base of the transistor Q512 may be an inverted version of a multi-location transmit signal $V_{TX1}$ received by the base of the transistor Q508. For example, an inverter circuit (not shown) may be located between the base of the transistor Q512 (i.e., the multi-location transmit signal $V_{TX1}$) and the base of the transistor Q508. The pull-down control signal $V_{PULL-DOWN1}$ also may be coupled (not shown) to the dimmer control circuit 315 (e.g., to an open drain output of a microprocessor), so that the dimmer control circuit 315 may pull down the base of the transistor Q512 to render the transistor Q512 non-conductive during the high impedance state (e.g., to disable control of the transistor Q512 in response to the pull-down control signal $V_{PULL-DOWN1}$). The transistor Q512 may be rendered conductive (e.g., only rendered conductive) when the transistor Q508 is rendered non-conductive during the communication time.

In the multi-location circuit 460, a pull-down control signal $V_{PULL-DOWN2}$ received by the base of the transistor Q530 may be an inverted version of a multi-location transmit signal $V_{TX2}$ received by the base of the transistor Q534. For example, an inverter circuit (not shown) may be located between the base of the transistor Q530 (e.g., the pull-down control signal $V_{PULL-DOWN2}$) and the base of the transistor Q534 (e.g., the multi-location transmit signal $V_{TX2}$). The pull-down control signal $V_{PULL-DOWN2}$ may be coupled (not shown) to the accessory control circuit 415 (e.g., to an open drain output of a microprocessor), so that the accessory control circuit 415 may pull down the base of the transistor Q530 to render the transistor Q530 non-conductive during the high impedance state (e.g., to disable control of the transistor Q512 in response to the pull-down control signal $V_{PULL-DOWN2}$). The transistor Q530 may be rendered conductive (e.g., only rendered conductive) when the transistor Q534 is rendered non-conductive during the communication time.

A load control device (e.g., such as the main dimmer 102 shown in FIG. 1, the control device 200 shown in FIG. 2, and/or the main load control device 300 shown in FIG. 3) may be subject to miswire conditions during and/or after installation. During the miswire conditions, the load control device may not be functional and/or may be damaged. As described herein, the load control device may be configured to detect one or more miswire conditions and disable the operation of the load control device until the miswire condition is removed. For example, the load control device may be configured to detect a hot-to-dimmed-hot miswire condition, in which a hot terminal of the load control device (e.g., the hot terminal H of the main dimmer 102) may be connected to an electrical load (e.g., the lighting load 108) and a dimmed-hot terminal (e.g., the dimmed-hot terminal DH) may be connected to a power source (e.g., the AC power source 106).

The load control device may also be configured to detect one or more miswire conditions at the accessory-dimmer terminal AD. For example, the load control device may be configured to detect a neutral-to-accessory-terminal miswire condition, in which the neutral side of the AC power source 106 is connected to the accessory-dimmer terminal AD of the main dimmer 102. In addition, the load control device may be configured to determine an accessory-dimmer miswire condition, in which one or more remote load control devices (e.g., accessory dimmers) are wired to the wrong side of the load control device (e.g., wired to the load side of the load control system 100 as shown in FIG. 1 when the remote load control devices should be wired to the line side of the load control system 100, or vice versa). Further the load control device may be further configured to determine an accessory-dimmer-terminal-hot-short miswire condition, in which the hot side of the AC power source 106 may be shorted (e.g., connected) to the accessory-dimmer terminal AD of the main dimmer 102.

During a hot-to-dimmed-hot miswire condition, the load control device may be powered, but may not be able to function correctly. For example, when the hot terminal H of the main load control device 300 is connected to the lighting load and the dimmed-hot terminal DH is connected to the AC power source during the hot-to-dimmed-hot miswire condition, the power supply 324 may be able to conduct the charging current through the dimmed-hot terminal DH, the neutral terminal N, and the body diode of the second FET Q314. Since the power supply 324 is able to charge and generate the DC supply voltage $V_{CC}$, the dimmer control circuit 315 may be powered and may be able to control the FETs Q312, Q314. However, since the zero-cross detect circuit 320 is coupled across the lighting load and not across the AC power source, the zero-cross signal $V_{ZC}$ may not correctly indicate zero-crossings of the AC line voltage $V_{AC}$ and the dimmer control circuit 315 may not be able to appropriately control the FETs Q312, Q314 using a phase-control dimming technique to adjust the intensity of the lighting load. The dimmer control circuit 315 may be configured to detect the hot-to-dimmed-hot miswire condition during a startup procedure of the main load control device (e.g., prior to attempting to control the first and second FETs Q312, Q314 using the phase-control dimming technique).

When the hot-to-dimmed-hot condition exists, the wiring to the hot terminal H and the dimmed-hot terminal DH may be swapped, such that AC line voltage $V_{AC}$ may be present at the dimmed-hot terminal DH and a phase-cut voltage may be present at the hot terminal H. The dimmer control circuit 315 may be configured to detect the hot-to-dimmed-hot miswire condition in response to the voltage developed across the controllably conductive device 310 (e.g., in response to the voltage-detect signal $V_{DET}$ as generated by the voltage detect circuit 326) when the controllably conductive device 310 is conductive. The dimmer control circuit 315 may be configured to control the controllably conductive device 310 to be non-conductive for a first portion of a half cycle and to be conductive for a second, subsequent portion (e.g., the remaining portion) of the half cycle (e.g., using the forward phase-control dimming technique) before attempting to determine if the hot-to-dimmed-hot miswire condition exists. The dimmer control circuit 315 may be configured to determine if the hot-to-dimmed-hot miswire condition exists by detecting that there is no voltage developed across the controllably conductive device 310 when the controllably conductive device is conductive during the second portion of the half cycle (e.g., there is a phase-cut voltage at the hot terminal H). For example, the dimmer control circuit 315 may be configured to control the second FET Q314 to be non-conductive for a first portion of a positive half cycle and conductive for a second remaining portion of the positive half cycle, and detect the hot-to-dimmed-hot miswire condition if there is no voltage generated across the controllably conductive device 310 when the second FET Q314 is conductive for the second portion of the positive half cycle.

Figure 6A:
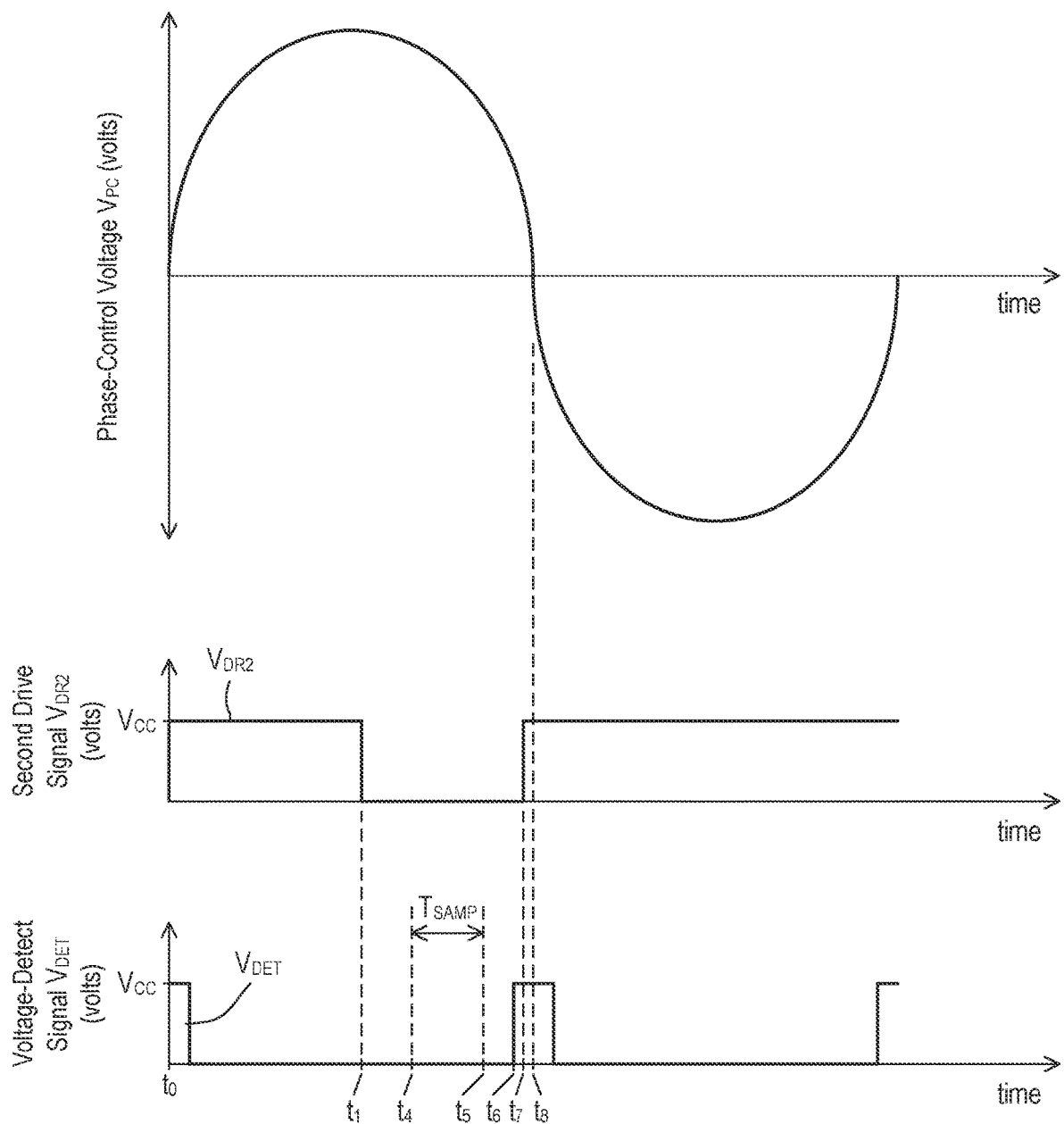
FIG. 6A depicts waveforms illustrating the operation of the main load control device of FIG. 3 when the main load control 300 is wired correctly.
Figure 6B:
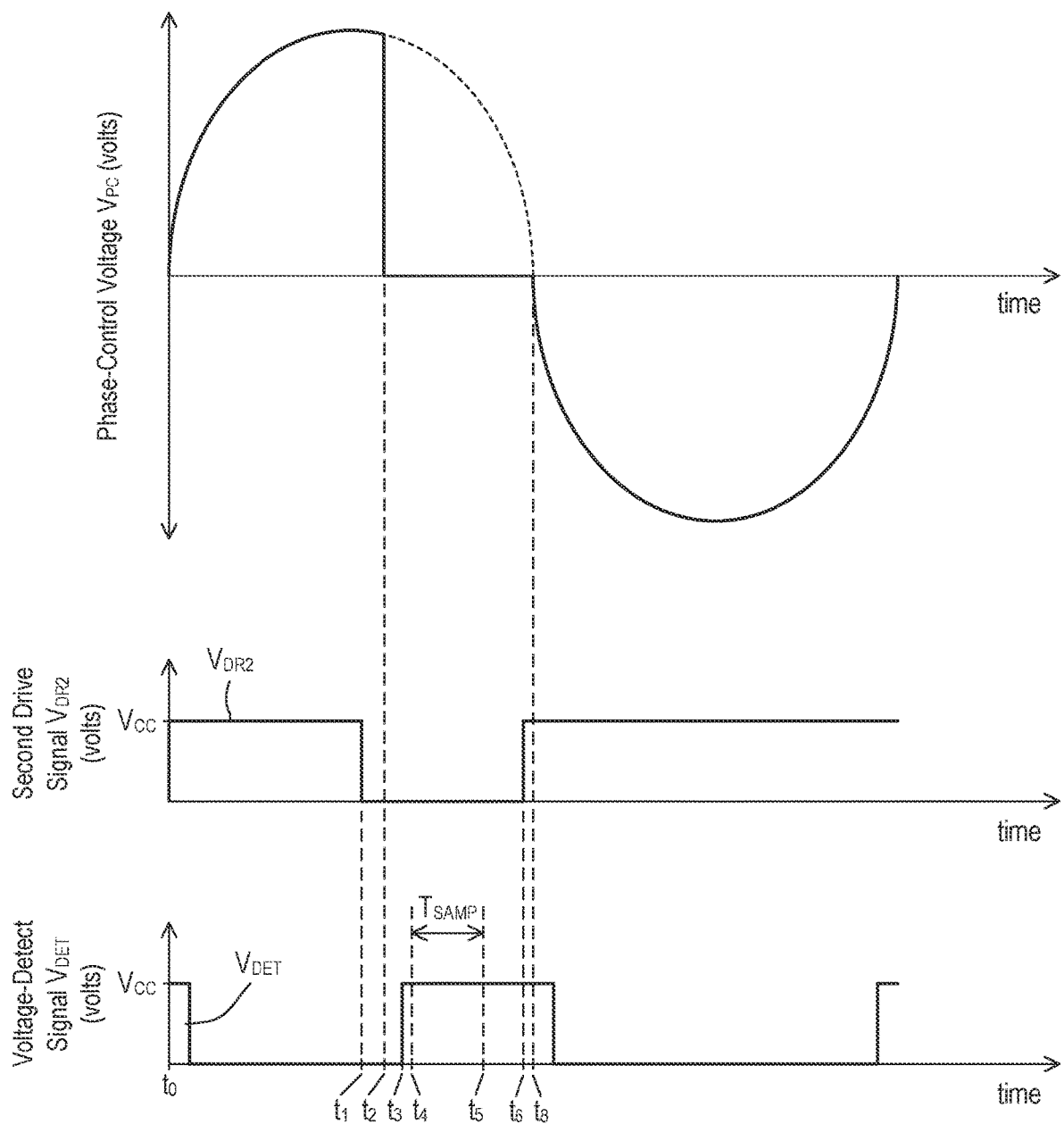
FIG. 6B depicts waveforms illustrating the operation of the main load control device of FIG. 3 during a hot-to-dimmed-hot miswire condition.

FIG. 6A depicts waveforms illustrating the operation of the main load control device 300 when the main load control device 300 is wired correctly (e.g., not during the hot-to-dimmed-hot miswire condition). FIG. 6B depicts waveforms illustrating the operation of the main load control device 300 during the hot-to-dimmed-hot miswire condition. While testing to determine if a hot-to-dimmed-hot miswire condition exists, the dimmer control circuit 315 may be configured to control the second drive signal $V_{DR2}$ to render the second FET Q314 conductive during a positive half cycle (e.g., while maintaining the first FET Q312 non-conductive). For example, the dimmer control circuit 315 may drive the magnitude of the second drive signal $V_{DR2}$ low to render the second FET Q314 conductive (e.g., as shown at time $t_1$ in FIGS. 6A and 6B). After rendering the second FET Q314 conductive during the positive half cycle, the dimmer control circuit 315 may be configured detect the hot-to-dimmed-hot miswire condition in response to the voltage developed across the controllably conductive device 310 (e.g., in response to the voltage-detect signal $V_{DET}$ as generated by the voltage detect circuit 326).

When the main load control device 300 is wired correctly, the second FET Q314 may be rendered conductive and non-conductive to conduct and block the load current $I_LO_{AD}$, respectively, during the negative half cycles (e.g., since the body diode of the second FET Q314 will block current during the negative half cycles). Since the first FET Q312 is maintained conductive in the positive half cycle, a voltage having a magnitude equal to the magnitude of the AC line voltage $V_{AC}$ may be present across the controllably conductive device 310 for the entire positive half cycle (e.g., as shown in FIG. 6A). In addition, the magnitude of the voltage-detect signal $V_{DET}$ may remain low after the second FET Q314 is rendered conductive (e.g., as shown in FIG. 6A) indicating the main load control device 300 is wired correctly. The voltage detect circuit 326 may drive the magnitude of the voltage-detect signal $V_{DET}$ high again when the magnitude of the AC line voltage $V_{AC}$ drops below the voltage threshold of the voltage detect circuit 326 near the end of the half cycle (e.g., at time $t_6$ of FIG. 6A).

During the hot-to-dimmed-hot miswire condition, the second FET Q314 may be configured to block the load current $I_{LOAD}$ after the second FET Q314 is rendered conductive during the positive half cycle. In addition, the body diode of the first FET Q314 may be configured to conduct the load current $I_{LOAD}$ during the positive half cycle even though the first FET Q314 may be maintained non-conductive during the positive half cycle. After the magnitude of the second drive signal $V_{DR2}$ is driven low to render the second FET Q314 conductive during the positive half cycle (e.g., at time $t_1$ in FIG. 6B), the second FET Q314 may become conductive (e.g., at time $t_2$ in FIG. 6B) and the voltage detect circuit 326 may drive the magnitude of the voltage-detect signal $V_{DET}$ high (e.g., at time $t_3$ in FIG. 6B) indicating the hot-to-dimmed-hot miswire condition exists. For example, the second FET Q314 may become conductive approximately 200 microseconds after the magnitude of the second drive signal $V_{DR2}$ is driven low, and the voltage detect circuit 326 may drive the magnitude of the voltage-detect signal $V_{DET}$ low approximately 157 microseconds after the second FET Q314 becomes conductive.

The dimmer control circuit 315 may be configured to wait after driving the magnitude of the second drive signal $V_{DR2}$ low and then sample the voltage-detect signal $V_{DET}$. For example, the dimmer control circuit 315 may sample the voltage-detect signal $V_{DET}$ multiple times during a sampling period $T_{SMPL}$ (e.g., between times $t_4$ and $t_5$ in FIGS. 6A and 6B). When the magnitude of the voltage-detect signal $V_{DET}$ remains low during the sampling period $T_{SMPL}$, the dimmer control circuit 315 may be configured to detect that the hot-to-dimmed-hot miswire condition does not exist (e.g., as shown in FIG. 6A). When the magnitude of the voltage-detect signal $V_{DET}$ is high during the sampling period $T_{SMPL}$, the dimmer control circuit 315 may be configured to detect that the hot-to-dimmed-hot miswire condition exists (e.g., as shown in FIG. 6B). The dimmer control circuit 315 may drive the magnitude of the second drive signal $V_{DR2}$ high to render the second FET Q314 non-conductive (e.g., at time $t_7$ in FIGS. 6A and 6B) before the end of the present half cycle (e.g., at time $t_8$ of FIGS. 6A and 6B).

During a neutral-to-accessory-terminal miswire condition, the main load control device 300 may be powered, and one or more components of the multi-location circuit 360 could be damaged. For example, when the neutral side of the AC power source is connected to the accessory-dimmer terminal AD of the main load control device 300 during the neutral-to-accessory-terminal miswire condition, the AC line voltage $V_{AC}$ may be coupled between the hot terminal H and the accessory-dimmer terminal AD. For example, when in the neutral-to-accessory-terminal miswire condition, the FET Q312 and/or the NPN bipolar junction transistor Q508 of the multi-location circuit 360 of the main load control device 300 may be damaged if the dimmer control circuit 315 attempts to render the second FET Q314 of the controllably conductive device 310 conductive during the negative half cycles. The dimmer control circuit 315 may be configured to detect the neutral-to-accessory-terminal miswire condition during a startup procedure of the main load control device (e.g., prior to attempting to render the first and second FETs Q312, Q314 conductive). For example, the dimmer control circuit 315 may be configured to detect the neutral-to-accessory-terminal miswire condition in response to the multi-location receive signal $V_{RX1}$ during the negative half cycles when the second FET Q314 is non-conductive. The dimmer control circuit 315 may be configured to detect the neutral-to-accessory-terminal miswire condition when the magnitude of the multi-location receive signal $V_{RX1}$ indicates that there is voltage at the accessory-dimmer terminal AD (e.g., the magnitude of the accessory-dimmer voltage $V_{AD}$ is greater than zero volts) during the negative half cycles.

Figure 7:
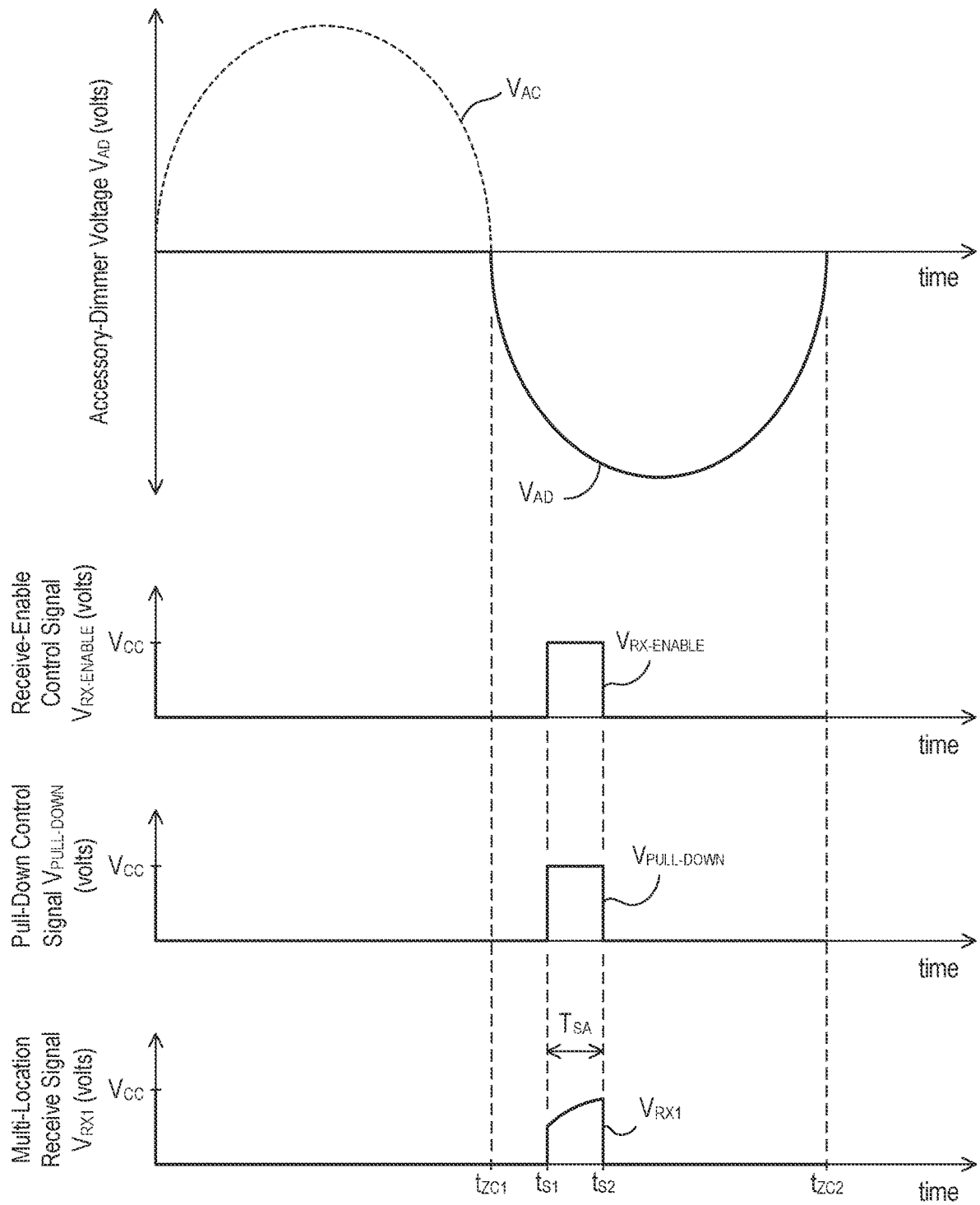
FIG. 7 depicts waveforms illustrating the operation of the main load control device of FIG. 3 during a neutral-to-accessory-terminal miswire condition.

FIG. 7 depicts waveforms illustrating the operation of the main load control device 300 during the neutral-to-accessory-terminal miswire condition. When the main load control device 300 is wired correctly, there may be substantially no voltage present at the accessory-dimmer terminal AD of the main load control device 300 (e.g., the magnitude of the accessory-dimmer voltage $V_{AD}$ is approximately zero volts). During the neutral-to-accessory-terminal miswire condition, the AC line voltage $V_{AC}$ will be coupled from the accessory-dimmer terminal AD to the hot terminal H (e.g., through the multilocation circuit 360 and the body diode of the first FET Q312) during the negative half cycles (e.g., the magnitude of the accessory-dimmer voltage $V_{AD}$ may be equal to the magnitude of the AC line voltage $V_{AC}$ during the negative half cycles as shown in FIG. 7). While testing to determine if the neutral-to-accessory-terminal miswire condition exists, the dimmer control circuit 315 may be configured to control the multi-location circuit 360 such that the multi-location receive signal $V_{RX1}$ is provided to the dimmer control circuit 315 during a negative half cycle (e.g., the negative half cycle between times $t_{ZC1}$ and $t_{ZC2}$ in FIG. 7). For example, the dimmer control circuit 315 may drive the magnitude of the receive-enable control signal $V_{RX\text{-}ENABLE1}$ high (e.g., at time $t_{S1}$ in FIG. 7) to render the transistor Q510 conductive such that the multi-location receive signal $V_{RX1}$ may be received by the dimmer control circuit 315. In addition, the dimmer control circuit 315 may be configured to discharge any voltage that may be produced at the accessory-dimmer terminal AD due to the capacitance of the accessory wiring (e.g., the accessory-dimmer line 109, 509) while the magnitude of the receive-enable control signal $V_{RX\text{-}ENABLE1}$ is being driven high to determine if the neutral-to-accessory-terminal miswire condition exists. For example, the dimmer control circuit 315 may be configured to discharge the voltage due to the capacitance of the accessory wiring by driving the magnitude of the pull-down control signal $V_{PULL\text{-}DOWN1}$ high (e.g., at time $t_{S1}$ in FIG. 7) to render the transistor Q512 conductive and discharge the capacitance of the accessory wiring through the resistor R526.

After driving the magnitudes of the receive-enable control signal $V_{RX\text{-}ENABLE1}$ and the pull-down control signal $V_{PULL\text{-}DOWN1}$ high during the negative half cycle (e.g., at time $t_{S1}$ in FIG. 7), the dimmer control circuit 315 may be configured detect the neutral-to-accessory-terminal miswire condition in response to the voltage at the accessory-dimmer terminal AD (e.g., as indicated by the multi-location receive signal $V_{RX1}$). When the main load control device 300 is wired correctly, the magnitude of the multi-location receive signal $V_{RX1}$ may remain low after the magnitudes of the receive-enable control signal $V_{RX\text{-}ENABLE1}$ and the pull-down control signal $V_{PULL\text{-}DOWN1}$ are driven high. During the neutral-to-accessory-terminal miswire condition, the multi-location receive signal $V_{RX1}$ may be a scaled version of the voltage at the accessory-dimmer terminal AD (e.g., as scaled by the resistors R522, R524) when the magnitudes of the receive-enable control signal $V_{RX\text{-}ENABLE1}$ and the pull-down control signal $V_{PULL\text{-}DOWN1}$ are driven high.

The dimmer control circuit 315 may be configured to wait after driving the magnitudes of the receive-enable control signal $V_{RX\text{-}ENABLE1}$ and the pull-down control signal $V_{PULL\text{-}DOWN1}$ high and then sample the multi-location receive signal $V_{RX1}$. The dimmer control circuit 315 may be configured to sample the multi-location receive signal $V_{RX1}$ multiple times before driving the magnitudes of the receive-enable control signal $V_{RX\text{-}ENABLE1}$ and the pull-down control signal $V_{PULL\text{-}DOWN1}$ low after sampling is complete (e.g., at time $t_{S2}$ in FIG. 7). When the magnitude of the multi-location receive signal $V_{RX1}$ remains low (e.g., between times $t_{S1}$ and $t_{S2}$ in FIG. 7), the dimmer control circuit 315 may be configured to detect that the neutral-to-accessory-terminal miswire condition does not exist. When the magnitude of the multi-location receive signal $V_{RX1}$ is high (e.g., between times $t_{S1}$ and $t_{S2}$ in FIG. 7), the dimmer control circuit 315 may be configured to detect that the neutral-to-accessory-terminal miswire condition exists (e.g., as shown in FIG. 7). While only one occurrence of sampling of the multi-location receive signal $V_{RX1}$ is shown in FIG. 7 (e.g., between times $t_{S1}$ and $t_{S2}$), the dimmer control circuit 315 may be configured to drive the magnitudes of the receive-enable control signal $V_{RX\text{-}ENABLE1}$ and the pull-down control signal $V_{PULL\text{-}DOWN1}$ high and sample the multi-location receive signal $V_{RX1}$ multiple times during the negative half cycle (e.g., as will be described in greater detail below with reference to FIG. 9).

During an accessory-dimmer miswire condition, one or more remote load control devices (e.g., accessory dimmers) may be wired to the wrong side of the main load control device 300. For example, the main load control device 300 may be configured to have the remote load control devices wired to the line side of the load control device and may be configured to charge and communicate with the remote load control devices during the positive half cycles. The accessory-dimmer miswire condition may exist when the remote load control devices are wired to the load side of the main load control device 300. During the accessory-dimmer miswire condition, the first main terminal H1 and/or the second main terminal H2 of the remote load control devices may be coupled to the dimmed-hot terminal DH of the load control device (e.g., rather than being coupled to the hot terminal H as shown in FIG. 5). When the remote load control devices are wired to the load side of the main load control device 300 (e.g., during the accessory-dimmer miswire condition), the main load control device 300 may not be able to appropriately charge and communicate with the miswired remote load control devices. The dimmer control circuit 315 may be configured to detect the accessory-dimmer miswire condition during a startup procedure of the main load control device (e.g., prior to attempting to render the first and second FETs Q312, Q314 conductive).

The dimmer control circuit 315 may be configured to detect the accessory-dimmer miswire condition by transmitting a message (e.g., a query message) via the multi-location circuit 360 during the positive half cycles. The dimmer control circuit 315 may determine that the accessory-dimmer miswire condition exists when a response message to the query message is received during the negative half cycles, and that the accessory-dimmer miswire condition does not exist when a response message to the query message is not received. In addition, the main load control device 300 may be configured to have the remote load control devices wired to the load side of the load control device and may be configured to charge and communicate with the remote load control devices during the negative half cycles. In this case, the accessory-dimmer miswire condition may exist when the remote load control devices are wired to the line side of the main load control device 300. When the remote load control devices are wired to the line side of the main load control device 300 (e.g., during the accessory-dimmer miswire condition), the main load control device 300 may not be able to appropriately charge and communicate with the miswired remote load control devices. The dimmer control circuit 315 may be configured to detect that the accessory-dimmer miswire condition exists by transmitting a message (e.g., a query message) via the multi-location circuit 360 during the negative half cycles. The dimmer control circuit 315 may determine that the accessory-dimmer miswire condition exists when a response message to the query message is received during the positive half cycles, and that the accessory-dimmer miswire condition does not exist when a response message to the query message is not received.

During an accessory-dimmer-terminal-hot-short miswire condition, the main load control device 300 may be powered, and one or more components of the multi-location circuit 360 could be damaged. For example, when the hot side of the AC power source is shorted (e.g., connected) to the accessory-dimmer terminal AD of the main load control device 300 during the accessory-dimmer-terminal-hot-short miswire condition, the AC line voltage $V_{AC}$ may be coupled between the hot terminal H and the accessory-dimmer terminal AD. For example, when in the accessory-dimmer-terminal-hot-short miswire condition, the main load control device 300 may not be able to appropriately charge and communicate with the remote load control devices. In addition, one or more components of the multi-location circuit 360 of the main load control device 300 may be damaged if the dimmer control circuit 315 attempts to render the second FET Q314 of the controllably conductive device 310 conductive during the negative half cycles when in the accessory-dimmer-terminal-hot-short miswire condition. The dimmer control circuit 315 may be configured to detect the accessory-dimmer-terminal-hot-short miswire condition during a startup procedure of the main load control device (e.g., prior to attempting to render the first and second FETs Q312, Q314 conductive). For example, the dimmer control circuit 315 may be configured to detect the accessory-dimmer-terminal-hot-short a miswire condition in response to the multi-location receive signal $V_{RX1}$ during the negative half cycles when the second FET Q314 is non-conductive. The dimmer control circuit 315 may be configured to detect the accessory-dimmer-terminal-hot-short miswire condition when the magnitude of the multi-location receive signal $V_{RX1}$ indicates that there is a substantially small voltage at the accessory-dimmer terminal AD (e.g., the magnitude of the accessory-dimmer voltage $V_{AD}$ is greater than zero volts) during the negative half cycles.

When the dimmer control circuit 315 detects one of the miswire conditions (e.g., the hot-to-dimmed-hot miswire condition, the neutral-to-accessory-terminal miswire condition, the accessory-dimmer miswire condition, and/or accessory-dimmer-terminal-hot-short miswire condition), the dimmer control circuit 315 may maintain the FETs Q312, Q314 non-conductive. For example, by maintaining the FETs Q312, Q314 non-conductive, the dimmer control circuit 315 may be unresponsive to any messages received via the wireless communication circuit 328 and/or input signals received from the actuators 330 in response to tactile actuations of the actuators 330, which may prevent undesired operation of the lighting load and/or damage to the main load control device 300. The dimmer control circuit 315 may start to control one the visible indicators 340 to be illuminated and to repetitively display an error code, for example, by blinking one or more of the visible indicators at a particular rate, pattern, sequence, etc. The dimmer control circuit 315 may continue to display the error code for a period of time before causing the dimmer control circuit 315 to reset. The main load control device 300 may then try to start up once again and test for the miswire conditions.

Figure 8:
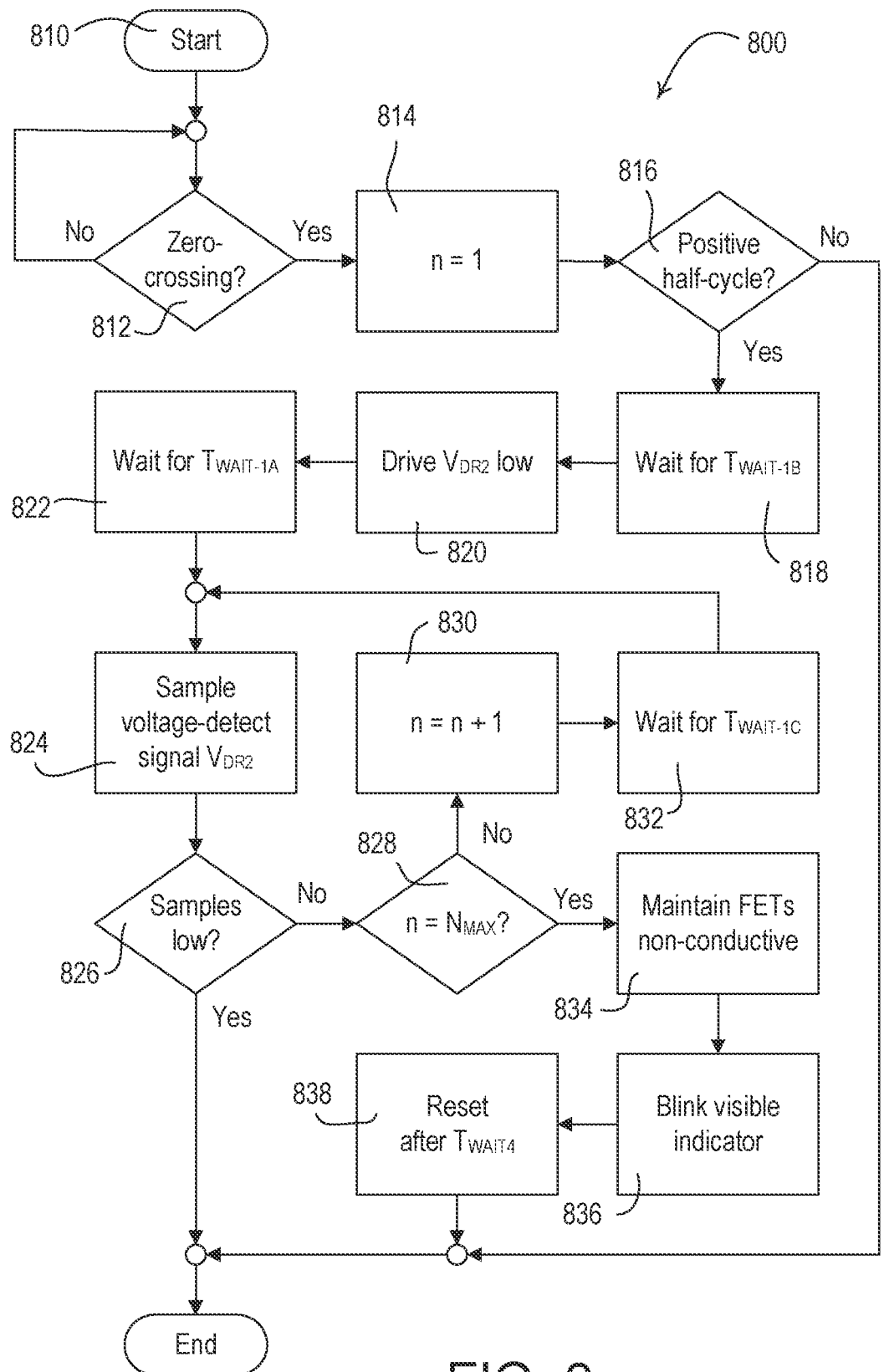
FIG. 8 is a flowchart of an example miswire detect procedure for detecting a hot-to-dimmed-hot miswire condition at a load control device.
Figure 12:
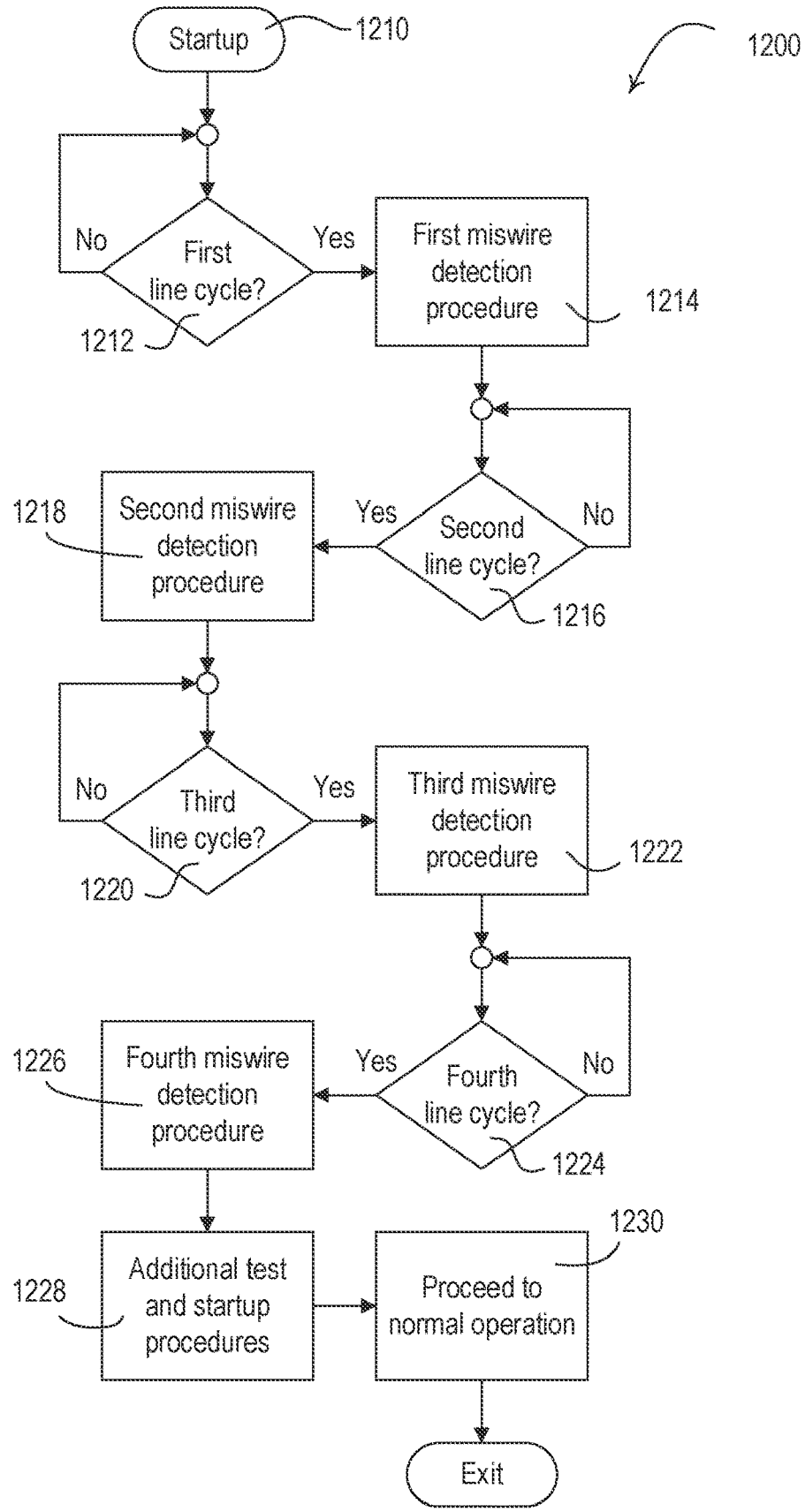
FIG. 12 is a flowchart of an example startup procedure that may be executed by a load control device at startup for detecting one or more miswire conditions.

FIG. 8 is a flowchart of an example miswire detect procedure 800 for detecting the hot-to-dimmed-hot miswire condition. For example, the miswire detect procedure 800 may be executed by a control circuit of a load control device (e.g., a control circuit of the main dimmer 102 shown in FIG. 1, a control circuit of the control device 200 shown in FIG. 2, and/or the dimmer control circuit 315 of the main load control device 300 shown in FIG. 3). The control circuit may execute the miswire detect procedure 800 at 810, for example, periodically and/or as part of a startup procedure of the control circuit (e.g., as shown in FIG. 12). The control circuit may be configured to render a second FET of a controllably conductive device (e.g., the second FET Q314 of the controllably conductive device 310) conductive during a positive half cycle and determine if a voltage is generated across the load control device to determine if the hot-to-dimmed-hot miswire condition exists.

At 812, the control circuit may wait for the next zero-crossing of the AC line voltage $V_{AC}$ (e.g., as indicated by the zero-cross signal $V_{ZC}$). When the control circuit detects a zero-crossing of the AC line voltage $V_{AC}$ at 812 (e.g., as shown at time $t_0$ in FIGS. 6A and 6B), the control circuit may initialize a variable n to one at 814. When the present half cycle is a positive half cycle at 816, the control circuit may wait for a first wait period $T_{WAIT-1A}$ (e.g., between times $t_0$ and $t_1$ in FIGS. 6A and 6B) at 818 and then render the second FET conductive at 620 (e.g., at time $t_1$ in FIGS. 6A and 6B). For example, the control circuit may drive the magnitude of the second drive signal $V_{DR2}$ low to render the second FET conductive at 820. For example, when the half cycle period THC is 8.33 milliseconds (e.g., the frequency of the AC line voltage $V_{AC}$ is approximately 60 Hz), the first wait period $T_{WAIT-1A}$ may be approximately 4.33 milliseconds, such that the control circuit controls the drive signal $V_{DR2}$ approximately 4 milliseconds before the end of the present half cycle.

At 822, the control circuit may wait for a second wait period $T_{WAIT-1B}$ (e.g., approximately 750 microseconds) at 818 before sampling the voltage-detect signal $V_{DET}$ at 824. For example, the control circuit may sample the voltage-detect signal $V_{DET}$ three times at a sampling interval of 100 microseconds (e.g., with 100 microseconds between each sample) at 824. If all of the multiple samples of the voltage-detect signal $V_{DET}$ are low at 826 (e.g., indicating that there is no voltage developed across the load control device), the control circuit may continue onto normal operation without detecting a miswire condition. If any of the multiple samples of the voltage-detect signal $V_{DET}$ are high at 826, the control circuit may determine if the variable n is equal to a maximum value $N_{MAX}$ (e.g., approximately three) at 828. If the variable n is not equal to the maximum value $N_{MAX}$ at 828, the control circuit may increment the variable n by one at 830 and wait for a third wait period $T_{WAIT-1C}$ (e.g., approximately 300 milliseconds) at 832 and then sample the voltage-detect signal $V_{DET}$ again at 824 (e.g., three samples at a sampling interval of 100 microseconds).

The control circuit may continue to sample the voltage-detect signal $V_{DET}$ at 824 and increment the variable n at 830 if any of the multiple samples of the voltage-detect signal $V_{DET}$ are high at 826, until the variable n is equal to the maximum value $N_{MAX}$ at 828. When the variable n is equal to the maximum value $N_{MAX}$ at 828, the control circuit may maintain the FETs (e.g., the first and second FETs Q312, Q314) non-conductive at 834. At 836, the control circuit may start to control one or more visible indicators (e.g., the visible indicators 340) to be illuminated and to repetitively display an error code, for example, by blinking one or more of the visible indicators at a particular rate, pattern, sequence, etc. At 838, the control circuit may wait for a fourth wait time $T_{WAIT4}$ (e.g., approximately five seconds) while continuing to display the error code before causing the control circuit to reset (e.g., thus causing the miswire detect procedure 800 to exit). Since the FETs Q312, Q314 are maintained non-conductive and the control circuit is prevented from entering normal operation after the hot-to-dimmed-hot miswire condition is detected, the control circuit may not be responsive to actuation of actuators (e.g., the actuators 330) and/or messages received via a wireless communication circuit (e.g., the wireless communication circuit 328) prior to resetting. In addition, the control circuit may be configured to transmit a message indicating the hot-to-dimmed-hot miswire condition to an external device (e.g., such as a system controller) via the wireless communication circuit prior to resetting.

Figure 9:
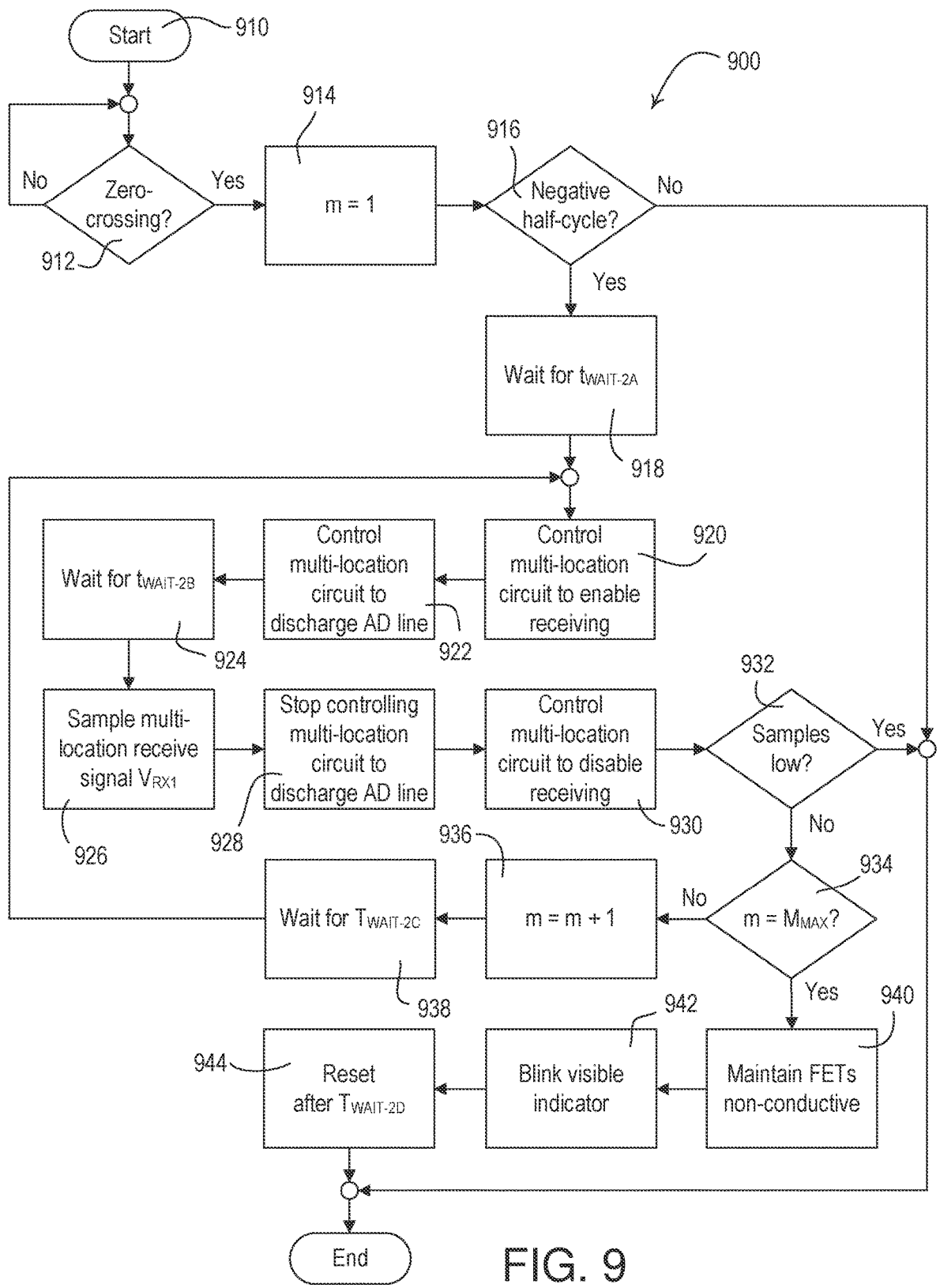
FIG. 9 is a flowchart of an example miswire detect procedure for detecting a neutral-to-accessory-terminal miswire condition at a load control device.

FIG. 9 is a flowchart of an example miswire detect procedure 900 for detecting the neutral-to-accessory-terminal miswire condition. For example, the miswire detect procedure 900 may be executed by a control circuit of a main load control device of a multiple-location load control system (e.g., a control circuit of the main dimmer 102 shown in FIG. 1, a control circuit of the control device 200 shown in FIG. 2, and/or the dimmer control circuit 315 of the main load control device 300 shown in FIG. 3). The control circuit may execute the miswire detect procedure 900 at 910, for example, periodically and/or as part of a startup procedure of the control circuit (e.g., as shown in FIG. 12). The control circuit may be configured to control a multi-location circuit (e.g., the multi-location circuit 360) and determine if voltage is present at an accessory-dimmer terminal (e.g., the accessory-dimmer terminal AD) during a negative half cycle to determine if the neutral-to-accessory-terminal miswire condition exists.

At 912, the control circuit may wait for the next zero-crossing of the AC line voltage $V_{AC}$ (e.g., as indicated by the zero-cross signal $V_{ZC}$). When the control circuit detects a zero-crossing of the AC line voltage $V_{AC}$ at 912 (e.g., as shown at time $t_{ZC1}$ in FIG. 7), the control circuit may initialize a variable m to one at 914. When the present half cycle is a negative half cycle at 916, the control circuit may wait for a first wait period $T_{WAIT-2A}$ (e.g., between times $t_{ZC1}$ and $t_{S1}$ in FIG. 7) at 918. For example, the first wait period $T_{WAIT-2A}$ may be approximately 400 microseconds. After waiting for the first wait period $T_{WAIT-2A}$ at 918, the control circuit may control the receive-enable control signal $V_{RX-ENABLE1}$ (e.g., by driving the magnitude of the receive-enable control signal $V_{RX-ENABLE1}$ high) to enable receiving of signals at the accessory-dimmer terminal AD by the multi-location circuit at 920 (e.g., at time $t_{S1}$ in FIG. 7). At 922, the control circuit may discharge any voltage at the accessory-dimmer terminal AD due to the capacitance of the accessory wiring by driving the magnitude of the pull-down control signal $V_{PULL-DOWN1}$ high (e.g., at time $t_{S1}$ in FIG. 7). At 924, the control circuit may wait for a second wait period $T_{WAIT-2B}$ (e.g., approximately 200 microseconds) before sampling the multi-location receive signal $V_{RX1}$ at 926. For example, the control circuit may sample the multi-location receive signal $V_{RX1}$ three times at a sampling interval of 100 microseconds (e.g., with 100 microseconds between each sample) at 926. After the control circuit is finished sampling the multi-location receive signal $V_{RX1}$ (e.g., at time $t_{S2}$ in FIG. 7), the control circuit may then drive the magnitude of the pull-down control signal $V_{PULL-DOWN1}$ low to stop discharging the capacitance on the accessory wiring at 928 and drive the magnitude of the receive-enable control signal $V_{RX-ENABLE1}$ low to disable receiving by the multi-location circuit at 930.

If all of the multiple samples of the multi-location receive signal $V_{RX1}$ are low at 932 (e.g., indicating that there is no voltage at the accessory-dimmer terminal AD of the main load control device), the control circuit may continue onto normal operation without detecting a miswire condition. For example, the control circuit may determine that one of the samples of the multi-location receive signal $V_{RX1}$ is low at 932 by determining if the sample is less than a voltage threshold (e.g., approximately 0.165 V). If any of the multiple samples of the multi-location receive signal $V_{RX1}$ are high at 932, the control circuit may determine if the variable m is equal to a maximum value $M_{MAX}$ (e.g., approximately three) at 934. If the variable m is not equal to the maximum value $M_{MAX}$ at 934, the control circuit may increment the variable m by one at 936 and wait for a third wait period $T_{WAIT-2C}$ (e.g., approximately 300-500 milliseconds) at 938 before controlling the receive-enable control signal $V_{RX-ENABLE1}$ and the pull-down control signal $V_{PULL-DOWN1}$ at 920 and 922, and sampling the multi-location receive signal $V_{RX1}$ again at 924 (e.g., three samples at a sampling interval of 100 microseconds).

The control circuit may continue to sample the multi-location receive signal $V_{RX1}$ at 924 and increment the variable m at 936 if any of the multiple samples of the multi-location receive signal $V_{RX1}$ are high at 932, until the variable m is equal to the maximum value $M_{MAX}$ at 934. When the variable m is equal to the maximum value $M_{MAX}$ at 934, the control circuit may maintain the FETs (e.g., the first and second FETs Q312, Q314) non-conductive at 940. At 942, the control circuit may start to control one or more visible indicators (e.g., the visible indicators 340) to be illuminated and to repetitively display an error code, for example, by blinking one or more of the visible indicators at a particular rate, pattern, sequence, etc. At 944, the control circuit may wait for a fourth wait time $T_{WAIT-D}$ (e.g., approximately five seconds) while continuing to display the error code before causing the control circuit to reset (e.g., thus causing the miswire detect procedure 900 to exit). Since the FETs Q312, Q314 are maintained non-conductive and the control circuit is prevented from entering normal operation after the neutral-to-accessory-terminal miswire condition is detected, the control circuit may not be responsive to actuation of actuators (e.g., the actuators 330) and/or messages received via a wireless communication circuit (e.g., the wireless communication circuit 328) prior to resetting. In addition, the control circuit may be configured to transmit a message indicating the neutral-to-accessory-terminal miswire condition to an external device (e.g., such as a system controller) via the wireless communication circuit prior to resetting.

Figure 10:
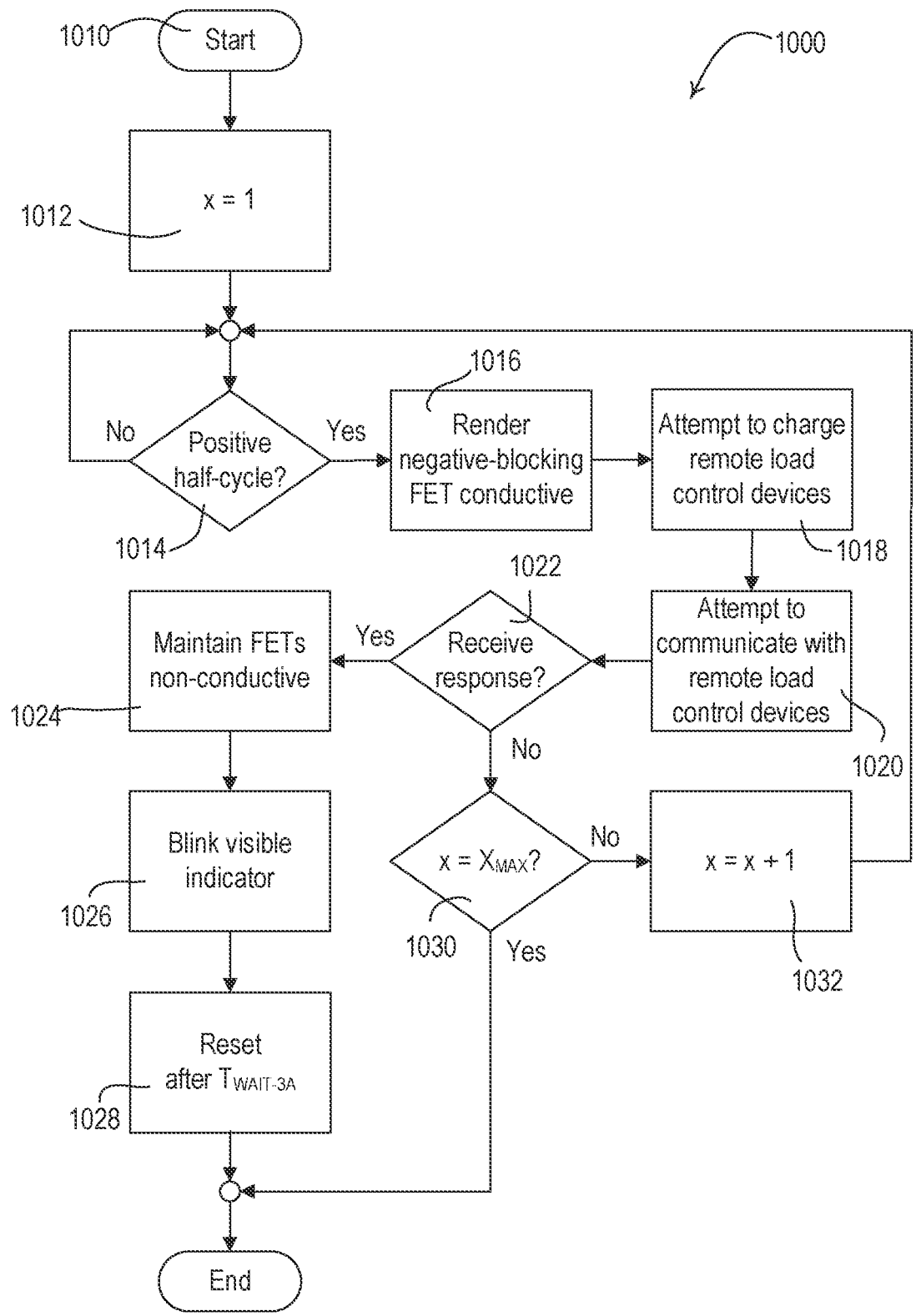
FIG. 10 is a flowchart of an example miswire detect procedure for detecting an accessory-dimmer miswire condition at a load control device.

FIG. 10 is a flowchart of an example miswire detect procedure 1000 for detecting the accessory-dimmer miswire condition. For example, the miswire detect procedure 1000 may be executed by a control circuit of a main load control device of a multiple-location load control system (e.g., a control circuit of the main dimmer 102 shown in FIG. 1, a control circuit of the control device 200 shown in FIG. 2, and/or the dimmer control circuit 315 of the main load control device 300 shown in FIG. 3). The control circuit may be coupled to one or more remote load control devices (e.g., the accessory dimmers 104 shown in FIG. 1) via an accessory-dimmer terminal (e.g., the accessory-dimmer terminal AD). The remote load control devices may be coupled to the line side of the main load control device. The main load control device may be configured to charge and/or communicate with the remote load control devices via a multi-location circuit (e.g., the multi-location circuit 360) during the negative half cycles. The control circuit may be configured to determine that the accessory-dimmer miswire condition exists by transmitting a message (e.g., a query message) via the multi-location circuit during one or more positive half cycles and determining if a response message to the query message is received. The control circuit may execute the miswire detect procedure 1000 at 1010, for example, periodically and/or as part of a startup procedure of the control circuit (e.g., as shown in FIG. 12).

At 1012, the control circuit may initialize a variable x to one and wait for the next positive half cycle at 1014. When the present half cycle is a positive half cycle at 1014, the control circuit may render a negative-blocking FET of a controllably conductive device of the load control device conductive at 1016 to enable charging and/or communication of the remote load control devices during the positive half cycle. For example, the dimmer control circuit 315 of the load control device 300 may render the second FET Q314 of the controllably conductive device 310 conductive at 1016. At 1018, the control circuit may attempt to charge any remote load control devices that may be connected on the load side of the load control device. For example, the dimmer control circuit 315 may render the transistor Q508 of the multi-location circuit 360 conductive at 1018. At 1020, the control circuit may attempt to communicate with any remote load control devices that may be connected on the load side of the load control device. For example, the dimmer control circuit 315 may control the transistors Q508, Q512 of the multi-location circuit 316 to transmit a message (e.g., a query message) via the accessory-dimmer terminal AD at 1020. Any remote load control device that are connected on the load side of the load control device may receive the query message and transmit a response message to the load control device in response to receiving the query message. In addition, the control circuit may include an error-code-flash command in the query message transmitted to the remote load control devices that may be connected on the load side of the load control device. Those remote control device that are connected on the load side of the load control device may control one or more visible indicators (e.g., the visible indicators 340) to display an error code, for example, by blinking one or more of the visible indicators at a particular rate, pattern, sequence, etc.

At 1022, the control circuit may determine if a response message to the query message is received from any remote load control devices that may be connected on the load side of the load control device. When a response message to the query message is received at 1022, the control circuit may maintain the FETs of the controllably conductive device (e.g., the first and second FETs Q312, Q314) non-conductive at 1024. At 1026, the control circuit may start to control one or more visible indicators (e.g., the visible indicators 340) to be illuminated and to repetitively display an error code, for example, by blinking one or more of the visible indicators at a particular rate, pattern, sequence, etc. At 1028, the control circuit may wait for a wait time $T_{WAIT-3A}$ (e.g., approximately five seconds) while continuing to display the error code before causing the control circuit to reset (e.g., thus causing the miswire detect procedure 1000 to exit). Since the FETs Q312, Q314 are maintained non-conductive and the control circuit is prevented from entering normal operation after the accessory-dimmer miswire condition is detected, the control circuit may not be responsive to actuation of actuators (e.g., the actuators 330) and/or messages received via a wireless communication circuit (e.g., the wireless communication circuit 328) prior to resetting. In addition, the control circuit may be configured to transmit a message indicating the accessory-dimmer miswire condition to an external device (e.g., such as a system controller) via the wireless communication circuit prior to resetting.

When a response message to the query message is not received at 1022, the control circuit may determine if the variable x is equal to a maximum value $X_{MAX}$ (e.g., approximately ten) at 1030. If the variable x is not equal to the maximum value $X_{MAX}$ at 1032, the control circuit may increment the variable x by one at 1030 and wait for the next positive half cycle at 1014 before attempting to charge and communicate with any remote load control devices that may be connected on the load side of the load control device once again. When the variable x is equal to the maximum value $X_{MAX}$ at 1032, the control may exit the miswire detect procedure 1000 and continue onto normal operation without detecting a miswire condition.

While the flowchart of the miswire detect procedure 1000 has been described with the remote control devices coupled to the line side of the main load control device, the remote load control devices may alternatively coupled to the load side of the main load control device. The main load control device may be configured to charge and/or communicate with the remote load control devices via the multi-location circuit during the positive half cycles. The control circuit may be configured to determine that the accessory-dimmer miswire condition exists by transmitting a message (e.g., a query message) via the multi-location circuit during one or more negative half cycles and determining if a response message to the query message is received. For example, during this alternative example, the dimmer control circuit 315 of the load control device 300 may wait for the next negative half cycle at 1014 and render the first FET Q312 of the controllably conductive device 310 conductive at 1016.

Figure 11:
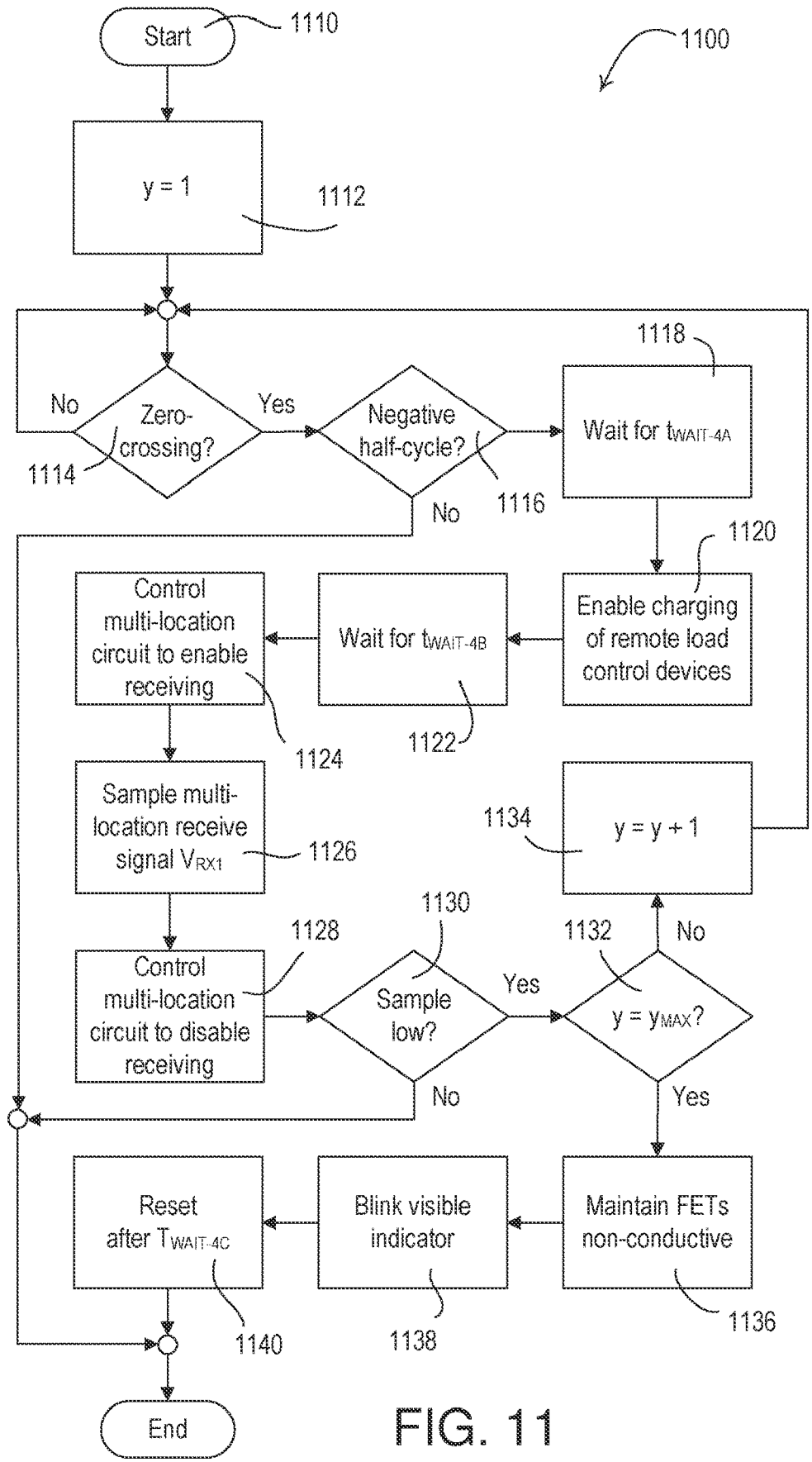
FIG. 11 is a flowchart of an example miswire detect procedure for detecting an accessory-dimmer-terminal-hot-short miswire condition at a load control device

FIG. 11 is a flowchart of an example miswire detect procedure 1100 for detecting the accessory-dimmer-terminal-hot-short miswire condition. For example, the miswire detect procedure 1100 may be executed by a control circuit of a main load control device of a multiple-location load control system (e.g., a control circuit of the main dimmer 102 shown in FIG. 1, a control circuit of the control device 200 shown in FIG. 2, and/or the dimmer control circuit 315 of the main load control device 300 shown in FIG. 3). The control circuit may execute the miswire detect procedure 1100 at 1110, for example, periodically and/or as part of a startup procedure of the control circuit (e.g., as shown in FIG. 12). The control circuit may be configured to control a multi-location circuit (e.g., the multi-location circuit 360) and determine if voltage is present at an accessory-dimmer terminal (e.g., the accessory-dimmer terminal AD) during a negative half cycle to determine if the neutral-to-accessory-terminal miswire condition exists.

The control circuit may initialize a variable y to one at 1112 and wait for the next zero-crossing of the AC line voltage $V_{AC}$ (e.g., as indicated by the zero-cross signal $V_{ZC}$) at 1114. When the control circuit detects a zero-crossing of the AC line voltage $V_{AC}$ at 1114, the control circuit may determine if the present half-cycle is a negative half-cycle at 1116. If not, the miswire detect procedure 1100 may exit. When the present half cycle is a negative half cycle at 1116, the control circuit may wait for a first wait period $T_{WAIT-4A}$ at 1118. For example, the first wait period $T_{WAIT-4A}$ may be approximately 600 microseconds. After waiting for the first wait period $T_{WAIT-4A}$ at 1118, the control circuit may enable charging of the remote load control devices at 1120. For example, the control circuit may pull the accessory-dimmer voltage $V_{AD}$ at the magnitude of the accessory-dimmer terminal AD up towards the magnitude of the bus voltage $V_{BUS}$ at 1120 to enable charging of the remote load control devices at 1120. At 1122, the control circuit may wait for a second wait period $T_{WAIT-B}$ (e.g., approximately one millisecond). After waiting for the second wait period $T_{WAIT-B}$ at 1122, the control circuit may control the receive-enable control signal $V_{RX-ENABLE1}$ (e.g., by driving the magnitude of the receive-enable control signal $V_{RX-ENABLE1}$ high) to enable receiving of signals at the accessory-dimmer terminal AD by the multi-location circuit at 1124 and sample the multi-location receive signal $V_{RX1}$ at 1126. After the control circuit is finished sampling the multi-location receive signal $V_{RX1}$ at 1126, the control circuit may then drive the magnitude of the receive-enable control signal $V_{RX-ENABLE1}$ low to disable receiving by the multi-location circuit at 1128.

At 1130, the control circuit may determine if the sample of the multi-location receive signal $V_{RX1}$ is low (e.g., indicating that there is no voltage at the accessory-dimmer terminal AD of the main load control device). For example, the control circuit may determine that the sample of the multi-location receive signal $V_{RX1}$ is low at 1130 by determining if the sample is less than a voltage threshold (e.g., approximately 0.165 V). If the sample is not low at 1130, the control circuit may continue onto normal operation without detecting a miswire condition. If the sample of the multi-location receive signal $V_{RX1}$ is low at 1130, the control circuit may determine if the variable y is equal to a maximum value $Y_{MAX}$ (e.g., approximately ten) at 1132. If the variable y is not equal to the maximum value $Y_{MAX}$ at 1132, the control circuit may increment the variable y by one at 1134, wait for the next zero-crossing at 1114, and sample the multi-location receive signal $V_{RX1}$ at 1126 during the next negative half-cycle.

The control circuit may continue to sample the multi-location receive signal $V_{RX1}$ at 1126 and increment the variable y at 1134 if the sample of the multi-location receive signal $V_{RX1}$ is low at 1130, until the variable y is equal to the maximum value $Y_{MAX}$ at 1132. When the variable y is equal to the maximum value $Y_{MAX}$ at 1112, the control circuit may maintain the FETs (e.g., the first and second FETs Q312, Q314) non-conductive at 1136. At 1138, the control circuit may start to control one or more visible indicators (e.g., the visible indicators 340) to be illuminated and to repetitively display an error code, for example, by blinking one or more of the visible indicators at a particular rate, pattern, sequence, etc. At 1140, the control circuit may wait for a third wait time $T_{WAIT-4C}$ (e.g., approximately five seconds) while continuing to display the error code before causing the control circuit to reset (e.g., thus causing the miswire detect procedure 900 to exit). Since the FETs Q312, Q314 are maintained non-conductive and the control circuit is prevented from entering normal operation after the accessory-dimmer-terminal-hot-short miswire condition is detected, the control circuit may not be responsive to actuation of actuators (e.g., the actuators 330) and/or messages received via a wireless communication circuit (e.g., the wireless communication circuit 328) prior to resetting. In addition, the control circuit may be configured to transmit a message indicating the accessory-dimmer-terminal-hot-short miswire condition to an external device (e.g., such as a system controller) via the wireless communication circuit prior to resetting.

FIG. 12 is a flowchart of an example startup procedure 1200 for detecting one or more miswire conditions, such as the hot-to-dimmed-hot miswire condition and/or the neutral-to-accessory-terminal miswire condition. For example, the startup procedure 1200 may be executed by a control circuit of a main load control device of a multiple-location load control system (e.g., a control circuit of the main dimmer 102 shown in FIG. 1, a control circuit of the control device 200 shown in FIG. 2, and/or the dimmer control circuit 315 of the main load control device 300 shown in FIG. 3). The control circuit may execute the startup procedure 1200 at 1210, for example, at startup of the control circuit (e.g., when the main load control device first powers up, when the AC line voltage $V_{AC}$ is applied to the main load control device, when a circuit breaker or the switching circuit providing power to the main load control device is switched on, and/or when the control circuit resets).

At 1212, the control circuit may wait for a first line cycle (e.g., a first line cycle after startup of control circuit, and/or a first line cycle during which the control circuit is ready to start operation). When the control circuit determines that it is in the first line cycle at 1212, the control circuit may execute a first miswire detection procedure for detecting a first miswire condition at the main load control device at 1214. For example, the first miswire detection procedure may be the miswire detection procedure 900 for detecting the neutral-to-accessory-terminal miswire condition (e.g., as shown in FIG. 9). The control circuit may execute the first miswire procedure at 1214 to detect a miswire condition at an accessory-dimmer terminal of the main load control device (e.g., the accessory dimmer-terminal AD of the main load control device 300). The control circuit may execute the first miswire detection procedure prior to attempting to render FETs of a controllably conductive device of the main load control device (e.g., the FETs Q312, Q314) conductive. When the control circuit detects the first miswire condition when executing the first miswire procedure at 1214, the control circuit may wait for a wait period (e.g., five seconds) and then reset. Upon reset, the control circuit may execute the startup procedure 1200 once again. When the first miswire condition has been fixed and/or does not exist, the control circuit may exit the first miswire procedure and move on to 1216.

When the first miswire condition does not exist when the control circuit executes the first miswire detection procedure at 1214, the control circuit may at 1216 wait for a second line cycle (e.g., a next line cycle after the first line cycle and/or a subsequent line cycle that is a number of line cycles after the first line cycle). When the control circuit determines that it is in the second line cycle at 1216, the control circuit may execute a second miswire detection procedure for detecting a second miswire condition at the main load control device at 1218. For example, the second miswire detection procedure may be the miswire detection procedure 800 for detecting the hot-to-dimmed-hot miswire condition (e.g., as shown in FIG. 8). The control circuit may execute the second miswire procedure at 1218 to detect a miswire condition at hot and dimmed-hot terminals of the main load control device (e.g., when the wiring to the hot terminal H and the dimmed-hot terminal DH of the main load control device 300 may be swapped). The control circuit may execute the second miswire detection procedure after executing the first miswire detection procedure at 1218 (e.g., after determining that the neutral-to-accessory-terminal miswire does not exist). The control circuit may execute the second miswire detection procedure prior to attempting to control FETs of a controllably conductive device of the main load control device (e.g., the FETs Q312, Q314) using a phase-control dimming technique. When the control circuit detects the second miswire condition when executing the second miswire procedure at 1218, the control circuit may wait for a wait period (e.g., five seconds) and then reset. Upon reset, the control circuit may execute the startup procedure 1200 once again. When the second miswire condition has been fixed and/or does not exist, the control circuit may exit the second miswire procedure and move on to 1220.

When the second miswire condition does not exist when the control circuit executes the second miswire detection procedure at 1218, the control circuit may at 1220 wait for a third line cycle (e.g., the next line cycle after the second line cycle and/or a subsequent line cycle that is a number of line cycles after the second line cycle). When the control circuit determines that it is in the third line cycle at 1220, the control circuit may execute a third miswire detection procedure for detecting a third miswire condition at the main load control device at 1222. For example, the third miswire detection procedure may be the miswire detection procedure 1000 for detecting the accessory-dimmer miswire condition (e.g., as shown in FIG. 10). The control circuit may execute the third miswire procedure at 1222 to detect a miswire condition of one or more remote load control devices (e.g., the accessory dimmers 104) that may be connected to the main load control device (e.g., the remote load control devices may be wired to the wrong side of the main load control device). The control circuit may execute the third miswire detection procedure after executing the second miswire detection procedure at 1218 (e.g., after determining that the hot-to-dimmed-hot miswire does not exist). The control circuit may execute the third miswire detection procedure prior to attempting to control FETs of a controllably conductive device of the main load control device (e.g., the FETs Q312, Q314) using the phase-control dimming technique. When the control circuit detects the third miswire condition when executing the third miswire procedure at 1222, the control circuit may wait for a wait period (e.g., five seconds) and then reset. Upon reset, the control circuit may execute the startup procedure 1200 once again. When the third miswire condition has been fixed and/or does not exist, the control circuit may exit the third miswire procedure and move on to 1224.

When the third miswire condition does not exist when the control circuit executes the third miswire detection procedure at 1222, the control circuit may at 1224 wait for a fourth line cycle (e.g., the next line cycle after the third line cycle and/or a subsequent line cycle that is a number of line cycles after the third line cycle). When the control circuit determines that it is in the fourth line cycle at 1220, the control circuit may execute a fourth miswire detection procedure for detecting a fourth miswire condition at the main load control device at 1226. For example, the fourth miswire detection procedure may be the miswire detection procedure 1100 for detecting the accessory-dimmer-terminal-hot-short miswire condition (e.g., as shown in FIG. 11). The control circuit may execute the fourth miswire procedure at 1226 to detect a miswire condition of one or more remote load control devices (e.g., the accessory dimmers 104) that may be connected to the main load control device (e.g., the remote load control devices may be wired to the wrong side of the main load control device). The control circuit may execute the fourth miswire detection procedure after executing the third miswire detection procedure at 1222 (e.g., after determining that the accessory-dimmer miswire does not exist). The control circuit may execute the fourth miswire detection procedure prior to attempting to control FETs of a controllably conductive device of the main load control device (e.g., the FETs Q312, Q314) using the phase-control dimming technique. When the control circuit detects the fourth miswire condition when executing the fourth miswire procedure at 1226, the control circuit may wait for a wait period (e.g., five seconds) and then reset. Upon reset, the control circuit may execute the startup procedure 1200 once again. When the fourth miswire condition has been fixed and/or does not exist, the control circuit may exit the fourth miswire procedure and move on to 1228.

When the first miswire condition does not exist when the control circuit executes the first miswire detection procedure at 1214, the second miswire condition does not exist when the control circuit executes the second miswire detection procedure at 1218, the third miswire conditions does not exist when the control circuit executes the third miswire detection procedure at 1222, and the fourth miswire conditions does not exist when the control circuit executes the fourth miswire detection procedure at 1226, the control circuit may perform additional test and/or startup procedures at 1228. At 1230, the control circuit may proceed to normal operation before the startup procedure 1200 exits.

In addition to what has been described herein, the methods and systems may also be implemented in a computer program(s), software, or firmware incorporated in one or more computer-readable media for execution by a computer(s) or processor(s), for example. Examples of computer-readable media include electronic signals (transmitted over wired or wireless connections) and tangible/non-transitory computer-readable storage media. Examples of tangible/non-transitory computer-readable storage media include, but are not limited to, a read only memory (ROM), a random-access memory (RAM), removable disks, and optical media such as CD-ROM disks, and digital versatile disks (DVDs).

While this disclosure has been described in terms of certain embodiments and generally associated methods, alterations and permutations of the embodiments and methods will be apparent to those skilled in the art. Accordingly, the above description of example embodiments does not constrain this disclosure. Other changes, substitutions, and alterations are also possible without departing from the spirit and scope of this disclosure.

The invention claimed is:

1. A load control device for controlling control an amount of power delivered from an alternating-current (AC) power source to an electrical load, the control device comprising:
   a hot terminal adapted to be coupled to a hot side of the AC power source;
   a dimmed-hot terminal adapted to be coupled to the electrical load;
   a controllably conductive device coupled between the hot terminal and the dimmed-hot terminal; and
   a control circuit configured to control the controllably conductive device using a phase-control dimming technique to control the amount of power delivered to the electrical load;
   wherein the control circuit is configured to determine whether a miswire condition exists, where the dimmed-hot terminal is coupled to the hot side of the AC power source and the hot terminal is coupled to the electrical load in the miswire condition, the control circuit further configured to maintain the controllably conductive device non-conductive in response to determining that the miswire condition exists.

2. The load control device of claim 1, further comprising:
   an accessory terminal adapted to be coupled to an accessory device; and
   a multi-location circuit coupled between the accessory terminal and a circuit common; and
   wherein the control circuit is configured to communicate messages with the accessory device via the accessory terminal.

3. The load control device of claim 2, wherein the miswire condition comprises a first miswire condition, the control circuit further configured to determine whether a second miswire condition exists at the accessory terminal and maintain the controllably conductive device non-conductive in response to determining that the second miswire condition exists.

4. The load control device of claim 3, wherein the multi-location circuit is configured to receive an accessory-dimmer voltage at the accessory terminal and scale the accessory-dimmer voltage to generate a multi-location receive voltage, the control circuit configured to receive a message from the accessory device in response to the multi-location receive voltage.

5. The load control device of claim 4, wherein, in the second miswire condition, the hot terminal is coupled to the hot side of the AC power source and the accessory terminal is coupled to the neutral side of the AC power source.

6. The load control device of claim 5, wherein the control circuit is configured to determine that the second miswire condition exists at the accessory terminal in response to the multi-location signal by detecting if voltage is present at the accessory terminal in a negative half cycle of the AC power source.

7. The load control device of claim 4, wherein, in the second miswire condition, the hot side of the AC power source at the hot terminal is coupled to the accessory terminal.

8. The load control device of claim 7, wherein the multi-location circuit is configured to determine that the second miswire condition exists at the accessory terminal in response to the multi-location signal during a negative half cycle of the AC power source by pulling a voltage at the accessory terminal up towards an accessory supply voltage and subsequently detecting if a magnitude of the multi location signal at the accessory terminal is substantially small.

9. The load control device of claim 3, wherein the control circuit is configured to communicate messages with the accessory device via the accessory terminal when the accessory device is coupled to a line side of the load control device; and
wherein, in the second miswire condition, the accessory device is coupled to a load side of the load control device.

10. The load control device of claim 9, wherein the control circuit is configured to communicate messages with the accessory device via the accessory terminal during negative half cycles, and determine whether the second miswire condition exists by attempting to communicate via the multi-location circuit during one or more positive half cycles.

11. The load control device of claim 1, further comprising:
a visible indicator configured to be illuminated;
wherein the control circuit is configured to illuminate the visible indicator to display an error code in response to determining that the miswire condition exists.

12. The load control device of claim 11, wherein the control circuit is configured to display the error code for a period of time before resetting.

13. The load control device of claim 1, wherein the control circuit is configured to control the controllably conductive device to be conductive for a first portion of a half cycle and non-conductive for a second portion of the half cycle, the control circuit further configured to determine that the miswire condition exists by detecting if voltage is not present across the controllably conductive device when the controllably conductive device is non-conductive during the second portion of the half cycle.

14. The load control device of claim 1, wherein the control circuit is configured to determine whether the miswire condition exists during a startup procedure executed before attempting to control the controllably conductive device using the phase-control dimming technique.

15. The load control device of claim 1, wherein the controllably conductive device comprises two field-effect transistors (FETs) coupled in anti-series connection.

16. The load control device of claim 15, further comprising:
a neutral terminal adapted to be coupled to a neutral side of the AC power source.

17. The load control device of claim 16, further comprising:
a power supply coupled between the hot terminal and the neutral terminal, the power supply configured to conduct a charging current through the AC power source to generate a direct-current supply voltage for powering the control circuit, the supply voltage referenced to the circuit common.

18. The load control device of claim 17, wherein a junction of the FETs is coupled to the circuit common to which the supply voltage is referenced; and
wherein, when the dimmed-hot terminal is coupled to the hot side of the AC power source and the hot terminal is coupled to the electrical load, the power supply is configured to conduct the charging current through the dimmed-hot terminal, the neutral terminal, and a body diode of one of the FETs of the controllably conductive device.

19. The load control device of claim 17, further comprising:
a wireless communication circuit powered by the supply voltage and configured to transmit and receive wireless signals;
wherein the control circuit is configured to adjust the amount of power delivered to the electrical load in response to the wireless signals received by the wireless communication circuit.

20. The load control device of claim 16, further comprising:
a zero-cross detect circuit coupled between the hot terminal and the neutral terminal, the zero-cross detect circuit including an active filter circuit configured to receive an AC line voltage from the AC power source and generate a zero-cross signal that represents zero-crossings of the AC line voltage;
wherein the control circuit is configured to control the FETs of the controllably conductive device using the phase-control dimming technique in response to the zero-cross signal.

21. The load control device of claim 15, further comprising:
a voltage detect circuit configured to generate a voltage-detect signal that indicates the magnitude of a voltage developed across the controllably conductive device;
wherein the control circuit is configured to detect if voltage is not present across the controllably conductive device when the controllably conductive device is non-conductive in response to the voltage-detect signal.

22. The load control device of claim 21, wherein the control circuit is configured to detect that one of the FETs of the controllably conductive device is shorted in response to the voltage-detect signal.

* * * * *